US007172847B2

(12) United States Patent
Goto

(10) Patent No.: US 7,172,847 B2
(45) Date of Patent: Feb. 6, 2007

(54) PLANOGRAPHIC PRINTING PLATE PRECURSOR AND PLANOGRAPHIC PRINTING PLATE PRECURSOR LAMINATE

(75) Inventor: Takahiro Goto, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 312 days.

(21) Appl. No.: 10/400,504

(22) Filed: Mar. 28, 2003

(65) Prior Publication Data

US 2003/0203313 A1 Oct. 30, 2003

(30) Foreign Application Priority Data

Mar. 28, 2002 (JP) ............................ 2002-091850

(51) Int. Cl.
*G03F 7/021* (2006.01)
*G03F 7/028* (2006.01)

(52) U.S. Cl. ...................... 430/157; 430/175; 430/176; 430/281.1; 430/288.1; 430/302

(58) Field of Classification Search ................ 430/157, 430/175, 176, 281.1, 288.1, 302
See application file for complete search history.

(56) References Cited

U.S. PATENT DOCUMENTS

| | | | | |
|---|---|---|---|---|
| 6,346,365 | B1 * | 2/2002 | Kawauchi et al. | 430/302 |
| 6,391,517 | B1 * | 5/2002 | Verschueren et al. | 430/270.1 |
| 6,936,404 | B2 * | 8/2005 | Denzinger et al. | 430/271.1 |
| 2002/0136979 | A1 * | 9/2002 | Miyake et al. | 430/156 |
| 2002/0182538 | A1 * | 12/2002 | Tomita et al. | 430/278.1 |
| 2003/0198888 | A1 * | 10/2003 | Kawauchi et al. | 430/270.1 |
| 2003/0207203 | A1 * | 11/2003 | Tsuchimura et al. | 430/270.1 |

FOREIGN PATENT DOCUMENTS

| | | | |
|---|---|---|---|
| EP | 0950514 | B1 | 10/1999 |
| JP | 6-3809 | A | 1/1994 |
| JP | 2000-131830 | A | 5/2000 |
| JP | 2000-235255 | A | 8/2000 |
| JP | 2001-347766 | A | 12/2001 |
| JP | 2002-90985 | A | 3/2002 |

* cited by examiner

*Primary Examiner*—John S. Chu
(74) *Attorney, Agent, or Firm*—Sughrue Mion, PLLC

(57) ABSTRACT

The present invention provides a planographic printing plate precursor comprising a substrate and a negative image recording layer provided on the substrate containing: a compound that generates a radical or an acid by light or heat; a polymerizable compound or a crosslinking compound; and an infrared ray absorbing agent, wherein a dynamic friction coefficient of the outermost surface of the planographic printing plate precursor, at the side of the negative image recording layer being provided toward an inserting paper inserted into between the planographic printing plate precursors when the planographic printing plate precursors are laminated, is within a range from 0.2 to 0.7, as well as a planographic printing plate precursor laminate comprising the pluralty of the planographic printing plate precursors and inserting paper.

23 Claims, No Drawings

PLANOGRAPHIC PRINTING PLATE PRECURSOR AND PLANOGRAPHIC PRINTING PLATE PRECURSOR LAMINATE

BACKGROUND OF THE INVENTION

1. Field of the Invention

The present invention relates to a planographic printing plate precursor and in particular to a planographic printing plate precursor capable of printing with an infrared laser for direct plate-making from digital signals in computers etc. Further, the invention relates to a laminate in which the planographic printing plate precursor capable of printing with an infrared laser is laminated on an inserting paper contacted with the outermost surface of the precursor at the side of a negative image recording layer, to protect the negative image recording layer etc.

2. Description of the Related Art

Development of lasers is remarkable in recent years, and in particular, high power output and miniaturization of solid lasers and semiconductor lasers having an emission range in the near infrared to infrared range are being developed. Accordingly, these lasers are very useful as light source used in exposure for direct plate-making from digital data in computers etc.

A negative planographic printing plate precursor for infrared laser, using an infrared laser having an emission region in the infrared ray region as light source used in exposure, utilizes a recording system where crosslinking reaction by an acid is caused by an acid generated as an initiator by light or heat to cure a recording layer on the region exposed to light, to form the image region, or polymerization reaction is caused by radicals generated as an initiator by heat to cure a recording layer on the region exposed to light, to form the image region, or when a dye is used as an infrared ray absorbing agent, polymerization reaction is caused by radicals generated as an initiator by transfer of electrons from the dye having absorbed infrared rays, to cure a recording layer on the region exposed to light thus forming the image region.

Because such negative image forming materials are inferior in image formability to those of positive type causing solubilization of the recording layer by the irradiation energy of an infrared laser, heat treatment called burning treatment or baking treatment is generally conducted after the development step in order to promote curing reaction such as crosslinking or polymerization to form a strong image region.

However, when an aluminum substrate is used in the planographic printing plate precursor provided with the recording layer, heat is diffused significantly into the highly thermally conductive substrate, so the energy of infrared rays irradiated is diffused into the substrate and not utilized for initiation and promotion of crosslinking or polymerization reaction for forming an image, thus failing to achieve sufficient sensitivity and strength of the image region.

To transfer a plurality of planographic printing plate precursors, use is made in some cases of a means of forming a laminate thereof by alternately laminating planographic printing plate precursors on inserting papers such that each inserting paper is contacted with a recording layer of the planographic printing plate precursor thereby protecting the recording layer. If the mechanical strength of the image region on the negative image recording layer is insufficient as described above, the friction between the recording layer and the inserting paper can cause damage to the surface of the recording layer upon transfer of the laminate with an auto-loader or upon removal of the inserting paper from the laminate. If the recording layer is damaged, an undesired curing reaction is initiated from the damaged region, resulting in the problem of staining on the non-image region.

In the planographic printing plate precursor provided with a negative image recording layer forming an image region by polymerization reaction, the negative image recording layer is provided in some cases with an overcoat layer having a function of shielding the recording layer against the air inhibiting the polymerization reaction. When a laminate made of the planographic printing plate precursors having such a structure and inserting papers is transferred, the friction between the overcoat layer and the inserting paper can cause damage to the surface of the overcoat layer. If the overcoat layer is damaged, the function of shielding the recording layer against oxygen in the damaged region is lost thus causing polymerization to be inhibited, resulting in occurrence of white mars on the image region.

SUMMARY OF THE INVENTION

An object of the present invention made in consideration of the problems in the prior art described above is to provide a planographic printing plate precursor capable of forming an image of high qualities without staining on the non-image region or white mars on the image region by preventing occurrence of mars on the surface of a negative image recording layer or overcoat layer even when the planographic printing plate precursor is laminated, transferred and stored. Another object of the invention is to provide a planographic printing plate precursor laminate preventing occurrence of mars on the surface of the negative image recording layer or overcoat layer and being excellent in transferability.

The inventors made extensive study on a means of preventing occurrence of mars attributable to the friction between the surface of the negative image recording layer or overcoat layer and the inserting paper, and as a result they found that the occurrence of mars is significantly influenced by the dynamic friction coefficient between the inserting paper and the outermost surface of the printing plate precursor which at the side of the negative image recording layer, is contacted with the inserting paper, and the invention was thereby completed.

One aspect of the invention provide a planographic printing plate precursor comprising a substrate and a negative image recording layer provided on the substrate containing: a compound that generates a radical or an acid by light or heat; a polymerizable compound or a crosslinking compound; and an infrared ray absorbing agent, wherein a dynamic friction coefficient of the outermost surface of the planographic printing plate precursor, at the side of the negative image recording layer being provided toward an inserting paper inserted into between the planographic printing plate precursors when the planographic printing plate precursors are laminated is within a range from 0.2 to 0.7.

Another aspect of the invention provides a planographic printing plate precursor laminate comprising planographic printing plate precursors and an inserting paper, wherein the planographic printing plate precursors each comprise a substrate and a negative image recording layer provided on the substrate containing: a compound that generates a radical or an acid by light or heat; a polymerizable compound or a crosslinking compound; and an infrared ray absorbing agent; wherein the inserting paper inserted into between the planographic printing plate precursors to be laminated; and wherein a dynamic friction coefficient of the outermost surface of the planographic printing plate precursor, at the side of the negative image recording layer being provided toward an inserting paper inserted into between the planographic printing plate precursors when the planographic printing plate precursors are laminated is within a range from 0.2 to 0.7.

In a more preferable aspect, the dynamic friction coefficient is 0.2 to 0.5.

According to the planographic printing plate precursor of the invention, when the dynamic friction coefficient is in the range defined above, the friction between the outermost surface of the precursor at the side of the negative image recording layer and the inserting paper is reduced so that regardless of whether the outermost surface is formed by the recording layer or overcoat layer, occurrence of mars on the surface can be prevented. Accordingly, an image of high qualities free of staining on the non-image region and white mars on the image region can be formed.

According to the planographic printing plate precursor of the invention, when the dynamic friction coefficient is in the range defined above, occurrence of mars can be prevented as described above, while sliding between the planographic printing plate precursor and the inserting paper can be prevented, and as a result, good transferability can be maintained.

DETAILED DESCRIPTION OF THE PREFERRED EMBODIMENT

Hereinafter, the planographic printing plate precursor and the planographic printing plate precursor laminate of the present invention are described in more detail.

Planographic Printing Plate Precursor

The planographic printing plate precursor of the invention comprises a negative image recording layer containing a compound that generates a radical or an acid by light or heat, a polymerizable or a crosslinking compound, and an infrared ray absorbing agent arranged on a substrate, wherein dynamic friction coefficient of the outermost surface of the planographic printing plate precursor, at the side of the negative image recording layer being provided toward an inserting paper inserted into between the planographic printing plate precursors when the planographic printing plate precursors are laminated is within a range from 0.2 to 0.7.

From the viewpoint of preventing occurrence of mars on the surface of the negative image recording layer or overcoat layer, the dynamic friction coefficient, on the inserting paper, of the outermost surface of the planographic printing plate precursor, at the side of the negative image recording layer is defined to be in the above specific range, in the planographic printing plate precursor of the invention. First, the inserting paper to be inserted into between the planographic printing plate precursors to be laminated is described.

Inserting Paper

The inserting paper is inserted into between the planographic printing plate precursors to be laminated, in order to reduce mechanical damage to the outermost surface, at the side of the negative printing layer, of the planographic printing plate precursor during storage or transfer.

As the inserting paper, a low-cost material is often selected to reduce the material cost, and examples of the inserting paper include a paper made of 100% wood pulp or wood pulp mixed with synthetic pulp, which may provided thereon with a low- or high-density polyethylene layer. In particular, the cost of a paper material not using synthetic pulp or a polyethylene layer is so low that the inserting paper can be produced at a lower cost.

The inserting paper is preferably a paper produced from a paper material prepared by beating bleached kraft pulp, then adding a sizing agent and a paper-strengthening agent in an amount of 0.1% and 0.2% respectively (based on the weight of the base paper) to the paper material diluted at a concentration of 4%, and adding aluminum sulfate until the pH value reaches 5.0, in which the inserting paper has a base weight of 29 to 60 g/m$^2$, preferably 25 to 50 g/m$^2$ (according to a measurement method prescribed in JIS P 8124) and a thickness of 42 to 80 μm, preferably 45 to 55 μm, more preferably 40 to 50 μm (according to a measurement method prescribed in JIS P 8118) and satisfies the following chemical requirements: when 20 g sample is cut into fine pieces, then placed in 100 g purified water and heated in a sealed state at 110° C. for 10 minutes, no $NH_3$ gas is detected by a method of detecting $NH_3$ gas by a Kitagawa gas detecting tube (for 20 ppm), and no turbidity occurs when the inserting paper is examined in a method of detecting a chloride by placing 3 ml of inserting paper in 6 ml of distilled water, then adding 2 drops of 1% silver nitrate solution into the sample, and examining whether chloride turbidity occurs or not. Along with the above-described degree of packing and chemical requirements, requirements of the preferable inserting paper, such as mechanical and strength characteristics, are shown in Table 1, but the requirements of the inserting paper are not limited thereto.

TABLE 1

| | Item | Unit | Value | Measurement method |
|---|---|---|---|---|
| 1 | Basis weight | g/m$^2$ | 29 to 60 | JIS P 8124 |
| 2 | Thickness | μm | 42 to 80 | JIS P 8118 |
| 3 | Difference in thickness | μm | 8 or less | Remark 1 |
| 4 | Water content | % | 4.0 to 6.0 | JIS P 8127 |
| 5 | Tensile strength (length) | kN | 1.31 or more | JIS P 8113 |
| 6 | Tensile strength (width) | kN | 0.65 or more | JIS P 8113 |
| 7 | Tear strength (length) | mN | 147 or more | JIS P 8116 |
| 8 | Tear strength (width) | mN | 196 or more | JIS P 8116 |
| 9 | Shrinkage (degree) | % | 0.7 or more | Remark 2 |
| 10 | Air permeability | sec. | 8 or more | JIS P 8117 |
| 11 | Smoothness (front) | sec. | 50 or more | JIS P 8119 |
| 12 | Smoothness (back) | sec. | 5 or more | JIS P 8119 |
| 13 | Extraction pH | — | 5.3 ± 0.5 | JIS P 8113 |
| 14 | Volume resistivity | Ω.cm | 1.0 × 10$^{10}$ or more | Remark 3 |
| 15 | Surface resistivity | Ω | 1.0 × 10$^9$ or more | Remark 4 |
| 16 | Stationary coefficient of friction | — | 0.35 or more | Remark 5 |
| 17 | $NH_3$ gas | — | shall not be detected | Remark 6 |
| 18 | Chloride | — | shall not be turbid | Remark 7 |

(Measurement conditions) Conditions not specified above are 20 ± 2° C. and 65 ± 2% RH.

Remarks in Table 1 are as Follows:

(Remark 1) Difference between the maximum and minimum of the thickness, at an arbitrary region, of one sheet measured according to JIS P 8118.

(Remark 2) The degree of shrinkage shown in the following equation: the degree of shrinkage=(B·A)/A×100 wherein A is the dimension (A) of the inserting paper dried at 110° C. for 1 hour and B is the dimension (B) of the same inserting paper which after the above drying, was left at 20° C. under 65% RH.

(Remark 3) Volume resistivity (ρv) determined from the equation ρv=19.62/t×Rv wherein 19.62 is the area (cm$^2$) of an electrode of a measuring machine (highly sensitive vibration volume type universal electrometer (trade names: MMAI•17 and P-601, manufactured by Kawaguchi Electric Works Co., Ltd.), t is the thickness of the inserting paper, and Rv is the volume resistance of the inserting paper measured by the measuring machine after cutting the inserting paper into a 150 mm×150 mm sheet and leaving the sheet at a temperature of 20° C. under 65% humidity for 3 hours or more.

(Remark 4) Volume resistivity (ρs) determined from the equation ρs=18.7×Rs wherein 18.7 is a coefficient calculated from the area of an electrode of a measuring machine (highly sensitive vibration volume type universal electrometer (trade names: MMAI•17 and P-601, manufactured by Kawaguchi Electric Works Co., Ltd.), and Rs is the surface resistance of the inserting paper measured by the measuring machine after cutting the inserting paper into a 150 mm×150 mm sheet and leaving the sheet at a temperature of 20° C. under 65% RH humidity for 3 hours or more.

(Remark 5) Stationary coefficient of friction between the inserting paper and the image-forming surface of the planographic printing plate (Remark 6) Determined by a Kitagawa gas detecting tube (for 20 ppm) after 20 g of sample was cut into fine pieces, placed in 100 g of purified water, and heated in a sealed state at 110° C. for 10 minutes.

(Remark 7) Judged with naked eyes by determining whether 6 ml of distilled water containing 3 ml of inserting paper turns turbid upon addition of 2 drops of 1% silver nitrate solution.

The inserting paper described above is particularly preferably the one having a basis weight of 30 to 60 g/m$^2$, a smoothness of 10 to 100 seconds in a method of measuring Bekk smoothness prescribed in JIS P 8119, a water content of 4 to 8% in a method of measuring a water content prescribed in JIS P 8127, and a density of 0.7 to 0.9 g/cm$^3$.

Dynamic friction coefficient, on the inserting paper, of the outermost surface at the side of the negative image recording layer In the invention, the “outermost surface at the side of the negative image recording layer” refers to the surface of the negative image recording layer in the case where the negative image recording layer only is arranged on a substrate, or to the surface of an overcoat layer or another topcoat when the overcoat or another topcoat is arranged on the negative image recording layer.

In the planographic printing plate precursor of the invention, the dynamic friction coefficient, on the inserting paper, of the outermost surface at the side of the negative image recording layer should be 0.2 to 0.7, from the viewpoint of preventing occurrence of mars on the surface of the negative image recording layer or overcoat layer. The dynamic friction coefficient is more preferably in the range of 0.2 to 0.5. When the dynamic friction coefficient is over the upper limit of this specified range, frictional mars occur easily, and staining on the non-image region and occurrence of white mars on the image region may not be prevented. On the other hand, when the dynamic friction coefficient is under the lower limit of the specified range, the inserting paper easily slides over the outermost surface at the side of the negative image recording layer so that the releasability of the inserting paper is improper while occurrence of frictional mars cannot be prevented. From the viewpoint of facilitating the operation of removing (releasing) the inserting paper, the upper limit of the dynamic friction coefficient, on the inserting paper, of the outermost surface at the side of the negative image recording layer is more preferably 0.68 or less.

The dynamic friction coefficient, on the inserting paper, of the outermost surface at the side of the negative image recording layer, can be regulated in the range defined above by smoothing the outermost surface of the negative image recording layer and/or regulating the composition of the outermost layer forming the outermost surface at the side of the negative image recording layer, depending on the physical properties of the surface to be contacted with the outermost surface of the inserting paper used.

For example, when the negative image recording layer forms the outermost surface at the side of the negative image recording layer, there is a method of regulating the dynamic friction coefficient in which a compound such as a fluorine-containing compound or a silane compound capable of lowering the surface energy of the recording layer is used as a component in the negative image recording layer. The component used in the method of regulating the dynamic friction coefficient by the component itself in the negative image recording layer includes fluorine type polymer compounds described in Japanese Patent Application No. 2001-288569 and a surface-orienting, infrared ray-absorbing alkali-soluble resin described in Japanese Patent Application No. 2001-193251. The dynamic friction coefficient can be regulated easily by regulating the content of these compounds in the range where the characteristics of the negative image recording layer are not deteriorated.

Alternatively, the dynamic friction coefficient may be regulated by adding another component to the negative image recording layer. For example, there is a method of using a fluorine- or silicone atom-containing nonionic surfactant and amphoteric surfactant or a method of adding a known lubricating agent such as wax. Further, the dynamic friction coefficient can also be regulated by blending the negative image recording layer coating solution with a compound having a long-chain alkyl group exhibiting orientation on the surface of the coating. Alternatively, the dynamic friction coefficient can also be regulated by adding compounds represented by the general formula (1) in Japanese Patent Application No. 2001-97299. These additives can easily regulate the dynamic friction coefficient by selecting their type and regulating the content.

When an overcoat layer forms the outermost surface at the side of the negative image recording layer, there is a method of regulating the dynamic friction coefficient by adding the compound capable of lowering surface energy, the surfactant, the known lubricating agent or the surface-orienting compound described above in such a range that the functions and physical properties necessary for the overcoat layer are not deteriorated.

Because the frictional properties can also be regulated by regulating the surface roughness of the negative image recording layer or overcoat layer, it is also effective to regulate various conditions and means for forming the negative image recording layer or overcoat layer.

Further, a top layer containing the compound regulating the dynamic friction coefficient or a top layer whose dynamic friction coefficient was regulated by regulating the surface roughness may be additionally arranged as the layer forming the outermost surface at the side of the negative image recording layer.

A method known in the art can be used as the method of measuring the dynamic friction coefficient, on the inserting paper, of the outermost surface at the side of the negative image recording layer, and the dynamic friction coefficient can be measured easily with practically sufficient accuracy particularly by a method shown in JIS P 8147. In this test, both the outermost surface at the side of the negative image recording layer and the surface of the inserting paper to be contacted, upon lamination, with the outermost surface at the side of the negative image recording layer are measured for their dynamic friction coefficient.

Planographic Printing Plate Precursor Laminate

The planographic printing plate precursor laminate of the invention comprises planographic printing plate precursors and an inserting paper, wherein the planographic printing plate precursors each comprise a substrate and a negative image recording layer provided on the substrate containing: a compound that generates a radical or an acid by light or heat; a polymerizable compound or a crosslinking compound; and an infrared ray absorbing agent; wherein the inserting paper inserted into between the planographic printing plate precursors to be laminated; and wherein a dynamic friction coefficient of the outermost surface of the planographic printing plate precursor, at the side of the negative image recording layer being provided toward an inserting paper inserted into between the planographic printing plate precursors when the planographic printing plate precursors are laminated is within a range from 0.2 to 0.7. The dynamic friction coefficient is more preferably in the range of 0.2 to 0.5. Such planographic printing plate precursor laminate has a function of protecting the negative image recording layer and is thus suitable for storage, safekeeping and transfer.

According to the planographic printing plate precursor laminate of the invention, occurrence of mars on the surface of the negative image recording layer or overcoat layer can be prevented by virtue of the dynamic friction coefficient in the range defined above. Further, the deterioration of transferability caused by easy sliding between the outermost surface at the side of the negative image recording layer and the inserting paper can be prevented due to the dynamic friction coefficient in the range defined above. The dynamic friction coefficient, on the inserting paper, of the outermost surface at the side of the negative image recording layer is more preferably 0.33 or more from the viewpoint of operativeness or 0.68 or less from the viewpoint of facilitating removal of the inserting paper, particularly preferably 0.35 to 0.65 from the viewpoint of facilitating setting of the plate before exposure to light, coping with twisting upon removal by an arm, and avoiding the influence of an air by a fan.

The means of regulating the dynamic friction coefficient in the range defined above can be applied to the outermost surface at the side of the negative image recording layer and/or the inserting paper in the planographic printing plate precursor laminate of the invention. The means of regulating the dynamic friction coefficient can be carried out by smoothing the outermost surface at the side of the negative image recording layer and the surface of the inserting paper or by regulating the composition of the outermost layer forming the outermost surface at the side of the negative image recording layer and/or the inserting paper.

Specifically, regulation of the dynamic friction coefficient of the outermost surface at the side of the negative image recording layer is carried out in the same manner as described above, regardless of whether the layer forming the outermost layer is the recording layer, the overcoat layer or another top layer.

The frictional properties of the inserting paper, on the other hand, can be regulated by impregnating the paper with an aqueous solution of a sizing agent such as rosin and alkyl ketene dimer, an aqueous solution of a surfactant, or a solution of a lubricating agent such as stearic acid glyceride. Further, the frictional properties can also be regulated by regulating the surface roughness, that is, by regulating the conditions of temperature and pressurization in calendering in a paper-making process.

Measurement of the dynamic friction coefficient between the outermost surface at the side of the negative image recording layer and the inserting paper is carried out by the same method as described above.

In the planographic printing plate precursor laminate of the invention, the means of regulating the dynamic friction coefficient can be applied to both the outermost surface at the negative image recording layer and the inserting paper, whereby effects such as good transferability and prevention of occurrence of mars on the surface of the negative image recording layer or overcoat layer can be achieved more easily.

Hereinafter, the elements constituting the invention are described.

Negative Image Recording Layer

The negative image recording layer in the planographic printing plate precursor of the invention is roughly divided, depending on the image-forming mechanism, into a photo-polymerizable layer and an acid-crosslinking layer.

The photo-polymerizable layer comprises (A) an infrared ray absorbing agent, (B) a radical generator (radical polymerization initiator), and (C) a radical polymerizable compound to be cured by polymerization reaction with a generated radical, and preferably further comprises (D) a binder polymer. The infrared ray absorbing agent converts absorbed infrared rays into heat, and by the generated heat, the radical polymerization initiator such as onium salt is decomposed to generate a radical, or an electron is transferred from the infrared ray absorbing agent having absorbed infrared rays to the radical polymerization initiator such as triazine, to generate a radical. The radical polymerizable compound is selected from compounds each having at least one ethylenically unsaturated double bond and at least one, preferably two or more, terminal ethylenically unsaturated bonds, and undergoes curing by polymerization reaction with generated radicals.

The acid-crosslinking layer comprises (E) a compound generating an acid by light or heat (referred to hereinafter as acid generator) and (F) a compound to be crosslinked with the generated acid (referred to hereinafter as crosslinking agent), and further (G) an alkali-soluble polymer capable of reacting with the crosslinking agent in the presence of an acid, to form a layer containing these components. In the acid-crosslinking layer, the acid generated by decomposition of the acid generator upon light irradiation or heating promotes the action of the crosslinking agent, to form a strong crosslinked structure by the crosslinking agent or by the crosslinking agent and the binder polymer, thus reducing the alkali solubility of the crosslinked layer to make the layer insoluble in a developing solution. For efficient utilization of the energy of an infrared laser, (A) infrared ray absorbing agent is incorporated into the recording layer.

Now, the components used in the negative image recording layer are described.

(A) Infrared Ray Absorbing Agent

The negative image recording layer in the planographic printing plate precursor of the invention is constituted such that an image can be recorded with a laser emitting infrared rays. In such a negative image recording layer, an infrared ray absorbing agent is preferably used. The infrared ray absorbing agent has a function of converting absorbed infrared rays into heat. By the generated heat, the radical generator or acid generator is decomposed to generate a radical or acid. The infrared ray absorbing agent used in the invention is preferably a dye or pigment having an absorption maximum at a wavelength in the range of 760 to 1200 nm.

The dye may be any commercial dyes including known dyes described in e.g. "Senryo Binran" (Dye Handbook) (published in 1970 and compiled by Society of Synthetic Organic Chemistry, Japan). Specifically those described in columns [0050] to [0051] in Japanese Patent Application Laid-Open (JP-A) No. 10-39509 can be mentioned.

Particularly preferable among these dyes are cyanine dyes, squarylium dyes, pyrylium salts and nickel thiolate complexes. The dyes are particularly preferably cyanine dyes, most preferably those cyanine dyes represented by the general formula (a):

General formula (a)

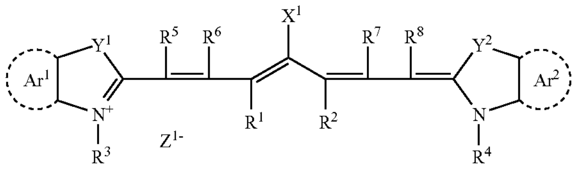

In the general formula (a), $X^1$ represents a hydrogen atom, a halogen atom, —$NPh_2$, $X^2$-$L^1$, or groups listed below. $X^2$ represents an oxygen atom, a nitrogen atom, or sulfur atom. $L^1$ represents a $C_{1-12}$ hydrocarbon group, an aromatic ring having hetero atoms, or a $C_{1-12}$ hydrocarbon group having hetero atoms. The hetero atoms herein referred includes N, S, O, halogen atoms, and Se. $Xa^-$ is defined as same as $Za^-$ shown below. $R^a$ is represents a substituent selected from the group consisting of a hydrogen atom, an alkyl group, an aryl group, an amino group which may be substituted, and a halogen group.

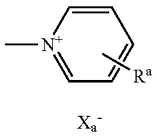

$R^1$ and $R^2$ independently represent a $C_{1-12}$ hydrocarbon group. For the storage stability of the image recording layer coating solution, each of $R^1$ and $R^2$ is preferably a hydrocarbon group containing 2 or more carbon atoms, and more preferably $R^1$ and $R^2$ are bound to each other to form a 5- or 6-memberred ring.

$Ar^1$ and $Ar^2$ may be the same or different, and represent an aromatic hydrocarbon group which may have a substituent group. The aromatic hydrocarbon group is preferably a benzene ring or a naphthalene ring. The substituent group is preferably selected from the group consisting of a hydrocarbon group containing 12 or less carbon atoms, a halogen atom, and an alkoxy group containing 12 or less carbon atoms. $Y^1$ and $Y^2$ may be the same or different, and represent a sulfur atom or a dialkyl methylene group containing 12 or less carbon atoms. $R^3$ and $R^4$ may be the same or different, and represent a hydrocarbon group containing 20 or less carbon atoms, which may have a substituent group. The substituent group is preferably an alkoxy group containing 12 or less carbon atoms, or a carboxyl group or a sulfo group. $R^5$, $R^6$, $R^7$ and $R^8$ may be the same or different, and represent a hydrogen atom or a hydrocarbon group containing 12 or less carbon atoms. Each of $R^5$, $R^6$, $R^7$ and $R^8$ is preferably a hydrogen atom because the starting material is easily available. $Za^-$ represents a counter anion. When the cyanine dyes represented by the general formula (a) is substituted with anionic groups and thus neutralization of electric charge is not required, $Za^-$ is not necessary. Because of the storage stability of the negative image recording layer coating solution, $Za^-$ is preferably a halogen ion, perchlorate ion, tetrafluoroborate ion, hexafluorophosphate ion and sulfonate ion, particularly preferably a perchlorate ion, hexafluorophosphate ion and aryl sulfonate ion.

The cyanine dyes represented by the general formula (I) which can be preferably used in the invention, include those described in columns [0017] to [0019] in Japanese Patent Application No. 11-310623.

The pigment used preferably in the invention includes commercial pigments and those described in Color Index (C. I.) Handbook, "Saishin Ganryo Binran" (Newest Pigment Handbook) (published in 1977 and compiled by Japanese Society of Pigment Technology), "Saishin Ganryho Oyo Gijyutsu" (Newest Pigment Applied Technology) (published in 1986 by CMC Publishing Co., Ltd.), and "Insatsu Inki Gijyutsu" (Printing Ink Technology) (published in 1984 by CMC Publishing Co., Ltd.).

As the type of pigment, mention is made of black pigments, yellow pigments, orange pigments, brown pigments, red pigments, violet pigments, blue pigments, green pigments, fluorescent pigments, metallic powder pigments, and other pigments such as polymer-binding dyes. These pigments are described in detail in columns [0052] to [0054] in JP-A No. 10-39509, and these can also be applied to the invention. A preferable pigment among those described above is carbon black.

The content of the dye or pigment in the negative image recording layer is preferably 0.01 to 50% by weight, more preferably 0.1 to 10% by weight, relative to the total solid content of the negative image recording layer, and the content of the dye is most preferably 0.5 to 10% by weight, and the content of the pigment is most preferably 1.0 to 10% by weight.

When the content is less than 0.01% by weight, the sensitivity may be lowered, while the content is higher than 50% by weight, the non-image region on the resultant planographic printing plate precursor may be stained.

(B) Radical-Generating Compound

The radical-generating compound that can be used preferably in the invention includes onium salts, which are specifically iodonium salts, diazonium salts and sulfonium salts. The onium salt functions not as an acid generator but also as a radical polymerization initiator when used in combination with a radical-polymerizable compound described later. The onium salts used preferably in the invention are those onium salts represented by the general formulae (II) to (IV):

$Ar^3—I^+—Ar^4(Z^2)^-$ General formula (II)

$Ar^5—N^+≡N(Z^3)^-$ General formula (III)

General formula (IV)

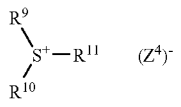

In the general formula (II), $Ar^3$ and $Ar^4$ independently represent an aryl group containing 20 or less carbon atoms, which may have a substituent group. When this aryl group has a substituent group, the substituent group is preferably a halogen atom, a nitro group, an alkyl group containing 12 or less carbon atoms, an alkoxy group containing 12 or less carbon atoms, or an aryloxy group containing 12 or less carbon atoms. $Z^{2-}$ represents a counterion selected from the group consisting of a halogen ion, perchlorate ion, tetrafluoroborate ion, hexafluorophosphate ion and sulfonate ion, and preferably $Z^{2-}$ is a perchlorate ion, hexafluorophosphate ion or aryl sulfonate ion.

In general formula (III), $Ar^5$ represents an aryl group containing 20 or less carbon atoms, which may have a substituent group. The substituent group is preferably a halogen atom, a nitro group, an alkyl group containing 12 or less carbon atoms, an alkoxy group containing 12 or less carbon atoms, an aryloxy group containing 12 or less carbon atoms, an alkylamino group containing 12 or less carbon atoms, a dialkyl amino group containing 12 or less carbon atoms, an aryl amino group containing 12 or less carbon atoms, or a diaryl amino group containing 12 or less carbon atoms. $Z^{3-}$ represents a counterion having the same meaning as defined for $Z^{2-}$.

In general formula (IV), $R^9$, $R^{10}$ and $R^{11}$ may be the same or different, and represent a hydrocarbon group containing 20 or less carbon atoms, which may have a substituent group. The substituent group is preferably a halogen atom, a nitro group, an alkyl group containing 12 or less carbon atoms, an alkoxy group containing 12 or less carbon atoms, or an aryloxy group containing 12 or less carbon atoms. $Z^{4-}$ represents a counterion having the same meaning as defined for $Z^{2-}$.

Examples of the onium salts that can be used preferably in the invention include those described in columns [0030] to [0033] in Japanese Patent Application No. 11-310623.

The onium salt used in the invention has a maximum absorption wavelength of preferably 400 nm or less, more preferably 360 nm or less. By using the onium salt having its absorption wavelength in the UV range, the planographic printing plate precursor can be handled under an incandescent lamp.

These onium salts can be added to the negative image recording layer coating solution in a ratio of 0.1 to 50% by weight, preferably 0.5 to 30% by weight, particularly preferably 1 to 20% by weight to the solids content of the negative image recording layer coating solution. If the amount of the onium salts added is less than 0.1% by weight, the sensitivity is lowered, while if the amount is greater than 50% by weight, staining occurs on the non-image region during printing. These onium salts may be used alone or in combination thereof. Further, these onium salts together with other components may be added to the same layer or another layer which has been separately arranged.

A triazine compound may be used as a radical generator (radical polymerization initiator). In this case, the triazine compound receives an electron from the infrared ray absorbing agent having absorbed infrared rays, to generate a radical.

(C) Radical-Polymerizable Compound

The radical-polymerizable compound used in the negative image recording layer in the invention is a radical-polymerizable compound having at least one ethylenically unsaturated double bond, and is selected from those compounds having at least one (preferably two or more) terminal ethylenically unsaturated bond. Such a compound group is well-known in this industrial field, and in the invention, these compounds can be used without any particular limitation. These compounds have chemical forms such as monomers, prepolymers, that is, dimers, trimers and oligomers, as well as mixtures and copolymers thereof. Examples of such monomers and copolymers include unsaturated carboxylic acids (e.g., acrylic acid, methacrylic acid, itaconic acid, crotonic acid, isocrotonic acid, maleic acid etc.) and esters and amides thereof, and preferably used are esters between unsaturated carboxylic acids and aliphatic polyvalent alcohols or amides between unsaturated carboxylic acids and aliphatic polyvalent amines. Further, unsaturated carboxylates having nucleophilic substituent groups such as hydroxyl group, amino group, mercapto group etc., addition-reaction products of amides with monofunctional or multifunctional isocyanates or epoxy compounds, and dehydration condensation reaction products of amides with monofunctional or multifunctional carboxylic acids. Further, unsaturated carboxylates having electrophilic substituent groups such as isocyanate group, epoxy group etc., addition-reaction products of amides with monofunctional or multifunctional alcohols, amines or thiols, unsaturated carboxylates having eliminating substituent groups such as halogen group, tosyloxy group etc., and substitution-reaction products of amides with monofunctional or multifunctional alcohols, amines or thiols. Further, a group of those compounds in which the above-described carboxylic acids have been replaced by unsaturated phosphonic acid, styrene etc. can also be used.

Radical polymerizable compounds that are esters of fatty polyvalent alcohols with unsaturated carboxylic acids, for example, acrylate, methacrylate, itaconate, crotonate, isocrotonate and maleate, are specifically described in columns [0037] to [0042] in Japanese Patent Application No. 11-310623, and these can also be used in the invention.

Examples of other preferably used esters include aliphatic alcohol type esters described in Japanese Patent Application Publication (JP-B) Nos. 46-27926, 51-47334 and JP-A No. 57-196231, those having an aromatic skeleton described in JP-A Nos. 59-5240, 59-5241 and 2-226149, and those having an amino group described in JP-A No. 1-165613.

As the monomers, the amides between aliphatic polyvalent amines and unsaturated carboxylic acids include e.g. methylene bis-acrylamide, methylene bis-methacrylamide, 1,6-hexamethylene bis-acrylamide, 1,6-hexamethylene bismethacrylamide, diethylene triamine trisacrylamide, xylylene bisacrylamide, xylylene bismethacrylamide etc.

Preferable examples of other amide type monomers include those having a cyclohexylene structure described in JP-B No. 54-21726.

Further, urethane type addition-polymerizable compounds produced by addition reaction between isocyanates and hydroxyl groups are also preferable, and examples thereof include vinyl urethane compounds containing two or more polymerizable vinyl groups in one molecule, which are prepared by adding vinyl monomers containing a hydroxyl group shown in general formula (V) below to polyisocyanates having two or more isocyanate groups in one molecule as described in JP-B No. 48-41708.

$$CH_2{=}C(R^{21})COOCH_2CH(R^{22})OH \qquad \text{General formula (V)}$$

wherein $R^{21}$ and $R^{22}$ represent H or $CH_3$.

Further, the urethane acrylates described in JP-A No. 51-37193, JP-B Nos. 2-32293 and 2-16765, and the urethane compounds having an ethylene oxide-type skeleton described in JP-B Nos. 58-49860, 56-17654, 62-39417 and 62-39418 are also preferable.

The radical-polymerizable compounds having an amino structure or sulfide structure in the molecule as described in JP-A Nos. 63-277653, 63-260909 and 1-105238 may also be used.

As other examples, the multifunctional acrylates and methacrylates such as polyacrylates and epoxy acrylates obtained by reacting epoxy resin with (meth)acrylic acid as described in JP-A No. 48-64183, JP-B Nos. 49-43191 and 52-30490 can be mentioned. Further, the specific unsaturated compounds described in JP-B Nos. 46-43946, 1-40337 and 1-40336, and the vinyl phosphonic acid-type compounds described in JP-A No. 2-25493, can also be mentioned. In some cases, the structure containing a perfluoroalkyl group described in JP-A No. 61-22048 is preferably used. Further, the photo-curable monomers and oligomers described in the Journal of Japanese Adhesive Society, vol. 20, No. 7, pp. 300–308 (1984) can also be used.

How these addition-polymerizable compounds are used, that is, what structure is used, whether these compounds are used alone or in combination thereof, and in which amount they are used, can be arbitrarily determined depending on the performance and design of the final sensitive material. For example, they are selected from the following viewpoints. In respect of sensitivity, their structure preferably has many unsaturated groups in one molecule, and in many cases, they are preferably bifunctional or more. To increase the strength of the part of an image i.e. the cured film, they are preferably trifunctional or more. Further, a method of regulating both photosensitivity and strength by combined use of those molecules (e.g. acrylates, methacrylates and styrene type compounds) having different functionalities and different polymerizable groups is also effective. While the high-molecular compounds or highly hydrophobic compounds are excellent in sensitivity and film strength, they may be undesirable in some cases in respect of developing speed and precipitation in a developing solution. The method of selecting and using the radical-polymerizable compound is an important factor for compatibility and dispersibility with other components (e.g. a binder polymer, an initiator, a coloring agent etc.) in the negative image recording layer, and the compatibility may be improved by using e.g. a low-purity compound or a combination of two or more compounds. A specific structure can be selected for the purpose of improving adhesion to a substrate, an overcoat etc. The ratio of the radical-polymerizable compound blended in the image recording layer is advantageously higher for sensitivity, but a too high ratio causes undesirable phase separation, problems in process caused by the adhesion of the image recording layer (e.g., defects in process caused by transfer and adhesion of components in the recording layer), and precipitation from the developing solution.

From these viewpoints, the compounding ratio in many cases is 5 to 80% by weight, preferably 25 to 75% by weight, relative to all components in the composition. The radical-polymerizable compounds may be used singly or in combination thereof. From the viewpoints of the degree of inhibition of polymerization by oxygen, resolution, fogging, a change in reflectance, and surface adhesion, a suitable structure, compounding and amount thereof can be arbitrarily selected in the method of using the radical-polymerizable compound, and further a layer structure and a coating method such as undercoating and overcoating can also be carried out as necessary.

(D) Binder Polymer

In the invention, a binder polymer is further used. As the binder, a linear organic polymer is preferably used. The "linear organic polymer" is not particularly limited. Preferably, a linear organic polymer soluble or swollen in water or weakly alkaline water is selected in order to enable development in water or development in weakly alkaline water. The linear organic polymer is selected not only as a film-forming agent for forming the negative image recording layer but also as a developing agent in water, weakly alkaline water, or an organic solvent, depending on use. For example, water development is feasible if a water-soluble organic polymer is used. Such linear organic polymers include radical polymers having carboxylic acid groups in their side chains, for example those described in JP-A No. 59-44615, JP-B Nos. 54-34327, 58-12577, 54-25957, JP-A Nos. 54-92723, 59-53836, and 59-71048, that is, methacrylic acid copolymers, acrylic acid copolymers, itaconic acid copolymers, crotonic acid copolymers, maleic acid copolymers, and partially esterified maleic acid copolymers. Further, there are acidic cellulose derivatives having carboxylic acid groups in their side chains. Besides, those radical polymers having hydroxyl groups, to which cyclic acid anhydrides have been added, are useful.

Among these polymers, (meth)acrylate resin having a benzyl or allyl group and a carboxyl group in side chains is particularly preferable because of good balance among film strength, sensitivity and developing properties.

Further, the urethane type binder polymers containing acid groups described in JP-B Nos. 7-12004, 7-120041, 7-120042, 8-12424, JP-A Nos. 63-287944, 63-287947, 1-271741, Japanese Patent Application No. 10-116232, etc. are very excellent in strength and thus advantageous in respect of printing resistance and low-irradiation suitability.

As other water-soluble linear organic polymers, polyvinyl pyrrolidone, polyethylene oxide etc. are useful. To increase the strength of the cured film, alcohol-soluble nylon, polyethers of 2,2-bis-(4-hydroxyphenyl)-propane and epichlorohydrin, etc. are also useful.

The weight average molecular weight of the polymer used in the invention is preferably 5000 or more, more preferably in the range of 10,000 to 300,000, and the number average molecular weight thereof is preferably 1000 or more, more preferably in the range of 2000 to 250,000. Polydispersity (weight average molecular weight/number average molecular weight) is preferably 1 or more, more preferably in the range of 1.1 to 10.

These polymers may be random polymers, block polymers or graft polymers, preferably random polymers.

The polymer used in the invention can be synthesized in a method known in the art. The solvent used in synthesis includes, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. These solvents are used alone or as a mixture thereof.

As the radical polymerization initiator used for synthesizing the polymer used in the invention, known compounds such as an azo-type initiator or a peroxide initiator can be used.

The binder polymers used in the invention may be used alone or as a mixture thereof. These polymers are added to the negative image recording layer coating solution in a ratio of 20 to 95% by weight, preferably 30 to 90% by weight, to the total solid content of the negative image recording layer coating solution. When the amount of the binder polymer added is less than 20% by weight, the portion of an image to be formed is poor in strength. When the amount of the binder polymer added is higher than 95% by weight, no image is formed. The ratio of the compound having radical-polymerizable ethylenically unsaturated double bonds/the linear organic polymer is preferably in the range of 1/9 to 7/3 by weight.

Now, the constitutional components of the acid-crosslinking layer are described. The infrared ray absorbing agent used herein may be the same as the infrared ray absorbing agent (A) described in the photo-polymerizable layer.

The content of the infrared ray absorbing agent is preferably 0.01 to 50% by weight, more preferably 0.1 to 10% by weight, relative to the total solid content of the negative image recording layer, and the content of the dye as the infrared ray absorbing agent is most preferably 0.5 to 10% by weight, and the content of the pigment is most preferably 1.0 to 10% by weight.

When the content is less than 0.01% by weight, the sensitivity may be lowered, while the content is higher than 50% by weight, the non-image region on the resultant planographic printing plate precursor may be stained.

(E) Acid Generator

The acid generator used in the negative image recording layer of the planographic printing plate precursor in this embodiment, which is to be decomposed with light or heat to generate an acid, refers to a compound generating an acid upon irradiation with light of a wavelength in the range of 200 to 500 nm or upon heating at 100° C. or more.

The acid generator includes known compounds capable of generating an acid upon thermal decomposition, such as a photo initiator for photo cation polymerization, a photo initiator for photo radical polymerization, a light decoloring or discoloring agent for pigments, or known acid generators used in micro-resists, as well as mixtures thereof.

For example, mention can be made of diazonium salts described in S. I. Schlesinger, Photogr. Sci. Eng., 18, 387 (1974), T. S. Bal et al., Polymer, 21, 423 (1980), ammonium salts described in U.S. Pat. No. 4,069,055 and JP-A No. 4-365049, phosphonium salts described in U.S. Pat. Nos. 4,069,055 and 4,069,056, iodonium salts described in European Patent No. 104,143, U.S. Pat. Nos. 339,049 and 410,201, JP-A Nos. 2-150848 and 2-296514, sulfonium salts described in European Patent Nos. 370,693, 390,214, 233,567, 297,443 and 297,442, U.S. Pat. Nos. 4,933,377, 161,811, 410,201, 339,049, 4,760,013, 4,734,444 and 2,833,827, and German Patent Nos. 2,904,626, 3,604,580 and 3,604,581, selenium salts described in J. V. Crivello et al., Macromolecules, 10(6), 1307 (1977) and J. V. Crivello et al., J. Polymer Sci., Polymer Chem. Ed., 17, 1047 (1979), onium salts such as arsonium salts described in C. S. Wen et al., Teh, Proc. Conf. Rad. Curing ASIA, p. 478, Tokyo, Oct (1988), organohalogen compounds described in U.S. Pat. No. 3,905,815, JP-B No. 46-4605, JP-A Nos. 48-36281, JP-A 55-32070, 60-239736, 61-169835, 61-169837, 62-58241, 62-212401, 63-70243 and 63-298339, organometal/organohalides described in JP-A No. 2-161445, optically acid generating agent having an o-nitrobenzyl type protective group described in European Patent Nos. 0290,750, 046,083, 156,535, 271,851 and 0,388,343, U.S. Pat. Nos. 3,901,710 and 4,181,531, JP-A Nos. 60-198538 and 53-133022, compounds generating sulfonic acid by photodegradation, such as iminosulfonates, described in European Patent Nos. 0199,672, 84515, 199,672, 044,115 and 0101,122, U.S. Pat. Nos. 4,618,564, 4,371,605 and 4,431,774, JP-A Nos. 64-18143, 2-245756 and Japanese Patent Application No. 3-140109, and disulfone compounds described in JP-A No. 61-166544.

Other preferable examples are polymer compounds having these acid generating groups or compounds introduced into major or side chains thereof, and such polymer compounds include those described in U.S. Pat. No. 3,849,137, German Patent No. 3,914,407, JP-A Nos. 63-26653, 55-164824, 62-69263, 63-146037, 63-163452, 62-153853 and 63-146029.

Further, compounds generating an acid by light, described in V. N. R. Pillai, Synthesis, (1), 1 (1980), A. Abad et al., Tetrahedron Lett., (47) 4555 (1971), D. H. R. Barton et al., J. Chem. Soc., (B), 329 (1970), U.S. Pat. No. 3,779,778 and European Patent No. 126,712, can also be used.

In the acid generators described above, the compounds represented by the general formulae (1) to (5) below are preferable.

General formula (1)

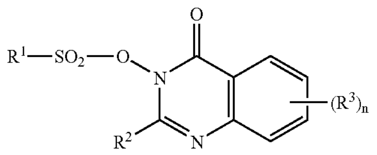

General formula (2)

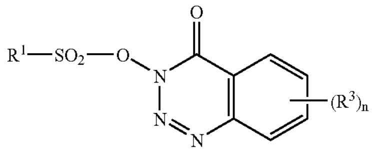

General formula (3)

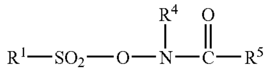

$Ar^1$—$SO_2$—$SO_2$—$Ar^2$ General formula (4)

General formula (5)

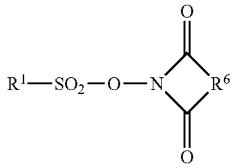

In the general formulae (1) to (5), $R^1$, $R^2$, $R^4$ and $R^5$ may be the same or different and represent an optionally substituted hydrocarbon group containing 20 or less carbon atoms. $R^3$ represents a halogen atom, an optionally substituted hydrocarbon group containing 10 or less carbon atoms or an alkoxy group containing 10 or less carbon atoms. $Ar^1$ and $Ar^2$ may be the same or different and represent an optionally substituted aryl group containing 20 or less carbon atoms. $R^6$ represents an optionally substituted divalent hydrocarbon group containing 20 or less carbon atoms. n is an integer of 0 to 4.

In the above general formulae, each of $R^1$, $R^2$, $R^4$ and $R^5$ is preferably a $C_{1-14}$ hydrocarbon group.

Preferable modes of the acid generators represented by the general formulae (1) to (5) are described in detail in columns [0197] to [0222] in Japanese Patent Application No. 11-320997. These compounds can be synthesized in methods described in e.g. JP-A Nos. 2-100054 and 2-100055.

Further, the acid generator (E) includes onium salts with halide or sulfonate as counterion, and in particular, acid generators in the form of iodonium salts, sulfonium salts and diazonium salts, represented by the following general formula (6) to (8), are preferable.

$Ar^3—I^+—Ar^4X^-$ General formula (6)

General formula (7)

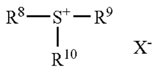

$Ar^3—N_2^+X^-$ General formula (8)

In the general formulae (6) to (8), $X^-$ represents a halide ion, $ClO_4^-$, $PF_6^-$, $SbF_6^-$, $BF_4^-$ or $R^7SO_3^-$, whereupon $R^7$ represents an optionally substituted hydrocarbon group containing 20 or less carbon atoms. $Ar^3$ and $Ar^4$ independently represent an optionally substituted aryl group containing 20 or less carbon atoms. $R^8$, $R^9$ and $R^{10}$ each represent an optionally substituted hydrocarbon group containing 18 or less carbon atoms.

Such onium salts are described as the compounds of the general formulae (I) to (III) in columns [0010] to [0035] in JP-A No. 10-39509.

The amount of the acid generator added is preferably 0.01 to 50% by weight, more preferably 0.1 to 25% by weight, most preferably 0.5 to 20% by weight, relative to the total solid content of the recording layer.

When its amount is less than 0.01% by weight, no image may be obtained, while the amount is higher than 50% by weight, the non-image region on the resultant planographic printing plate precursor may be stained during printing.

The acid generators described above may be used alone or as a mixture thereof.

(F) Crosslinking Agent

Hereinafter, the crosslinking agent is described. The crosslinking agent includes the following:

(i) An aromatic compound substituted with a hydroxymethyl or alkoxymethyl group.

(ii) A compound having a N-hydroxymethyl group, N-alkoxymethyl group or N-acyloxymethyl group.

(iii) An epoxy compound.

Hereinafter, the compounds (i) to (iii) above are described in detail.

(i) The aromatic compound substituted with a hydroxymethyl or alkoxymethyl group includes, for example, aromatic or heterocyclic compounds substituted with a plurality of hydroxymethyl, acetoxymethyl or alkoxymethyl groups. The compound also includes resinous compounds obtained by polycondensation of phenols known as resol resin with aldehydes under basic conditions.

The aromatic or heterocyclic compounds substituted with a plurality of hydroxymethyl or alkoxymethyl groups are preferably those compounds having hydroxymethyl or alkoxymethyl groups at positions adjacent to hydroxy groups.

The aromatic or heterocyclic compounds substituted with a plurality of alkoxymethyl groups are preferably those compounds having $C_{18}$ or less alkoxymethyl groups, more preferably those compounds represented by the general formulae (9) to (12):

General formula (9)

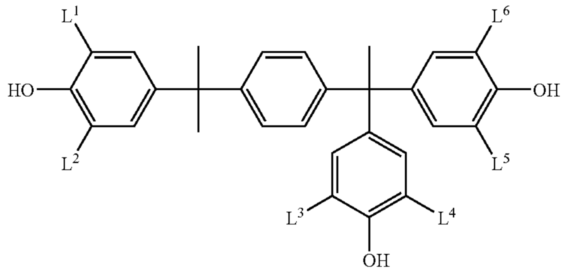

General formula (10)

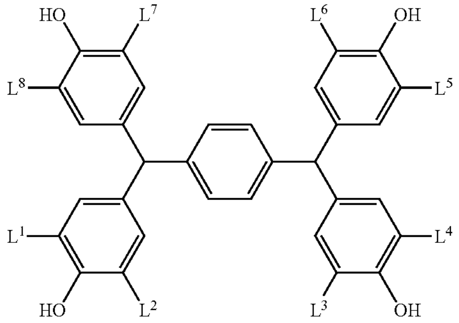

General formula (11)

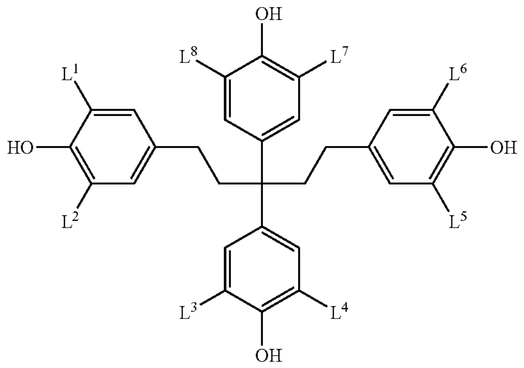

General formula (12)

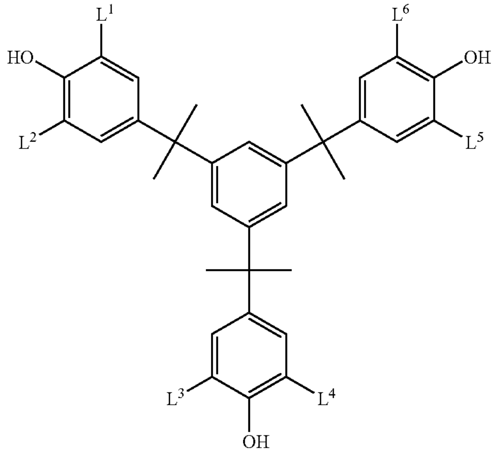

In the general formulae (9) to (12), $L^1$ to $L^8$ independently represent a hydroxymethyl or alkoxymethyl group substituted with a $C_{18}$ or less alkoxy group such as methoxymethyl, ethoxymethyl etc.

These crosslinking agents are preferable in respect of high crosslinking efficiency and improvement in printing resistance.

(ii) The compound having a N-hydroxymethyl group, N-alkoxymethyl group or N-acyloxymethyl group includes monomers, oligomer-melamine-formamide condensates, and urea-formaldehyde condensates described in European Patent Application Laid-Open (EP-A) No. 0,133,216 and West German Patent Nos. 3,634,671 and 3,711,264, and alkoxy-substituted compounds described in EP-A 0,212,482.

In particular, the crosslinking agent is more preferably a melamine-formaldehyde derivative having at least 2 free N-hydroxymethyl, N-alkoxymethyl or N-acyloxymethyl groups, most preferably N-alkoxymethyl derivative.

(iii) The epoxy compound includes epoxy compounds in the form of a monomer, dimer, oligomer or polymer, containing one or more epoxy groups, and examples thereof include reaction products of bisphenol A with epichlorohydrin, reaction products of low-molecular phenol-formaldehyde resin with epichlorohydrin, etc.

In addition, epoxy resins described and used in U.S. Pat. No. 4,026,705 and UK Patent No. 1,539,192 can also be mentioned.

When the compounds (i) to (iii) above are used as the crosslinking agent, their amount is preferably 5 to 80% by weight, more preferably 10 to 75% by weight, most preferably 20 to 70% by weight, based on the total solid content of the negative image recording layer.

If the amount of the crosslinking agent added is less than 5% by weight, the durability of the negative image recording layer in the resultant image recording material may be deteriorated, while if the amount thereof is higher than 80% by weight, the storage stability may be deteriorated.

In the invention, (iv) phenol derivatives represented by the general formula (13) can also be preferably used as the crosslinking agent.

General formula (13)

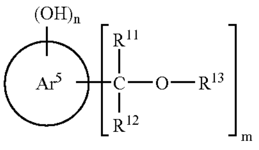

In the general formula (13), $Ar^5$ represents an aromatic hydrocarbon ring which may have a substituent group, and $R^{11}$, $R^{12}$ and $R^{13}$ represent a hydrogen atom or a hydrocarbon group containing 12 or less carbon atoms. Further, m is an integer of 2 to 4, and n is an integer of 1 to 3.

For the availability of the starting material, the aromatic hydrocarbon ring is preferably a benzene ring, a naphthalene ring or an anthracene ring. The substituent group is preferably a halogen atom, a hydrocarbon group containing 12 or less carbon atoms, an alkoxy group containing 12 or less carbon atoms, an alkylthio group containing 12 or less carbon atoms, a cyano group, a nitro group or a trifluoromethylene group. Among these, $Ar^5$ is more preferably an unsubstituted benzene or naphthalene ring or a benzene or naphthane ring substituted with a halogen atom, a hydrocarbon group containing 6 or less carbon atoms, an alkoxy group containing 6 or less carbon atoms, an alkylthio group containing 6 or less carbon atoms, an alkylcarbamoyl group containing 12 or less carbon atoms, or a nitro group.

The hydrocarbon group represented by $R^{11}$ and $R^{12}$ is preferably a methyl group because of easier synthesis. The hydrocarbon group represented by $R^{13}$ is preferably a hydrocarbon group containing 7 or less carbon atoms, such as methyl group or benzyl group, because of higher sensitivity. For easier synthesis, m is preferably 2 or 3, and n is preferably 1 or 2.

(G) Alkaline Water-Soluble Polymer Compound

The alkaline water-soluble polymer compound usable in the crosslinked layer in the invention includes a novolak resin and a polymer having a hydroxyaryl group in a side chain. The novolak resin includes resins having phenols condensed with aldehydes under acidic conditions.

Particularly preferable examples of such resins include novolak resin obtained from phenol and formaldehyde, novolak resin obtained from m-cresol and formaldehyde, novolak resin obtained from p-cresol and formaldehyde, novolakresin obtained from o-cresol and formaldehyde, novolak resin obtained from octyl phenol and formaldehyde, novolak resin obtained from m- and p-cresol and formaldehyde, novolak resin obtained from a phenol/cresol mixture (i.e. a mixture of m-, p-, o- or m-phenol/p-cresol, m-phenol/o-cresol, or o-phenol/p-cresol) and formaldehyde, or high-molecular-weight novolak resin having a high degree of ortho-binding obtained by reacting phenol with p-formaldehyde as the starting materials under high pressure in a sealed state without using a catalyst.

Depending on the object, the novolak resin may be selected suitably from novolak resins having a weight average molecular weight of 800 to 300,000 and a number average molecular weight of 400 to 60,000.

The above polymer having a hydroxyaryl group in a side chain is also preferable, and the hydroxyaryl group in the polymer is an aryl group having one or more OH groups added thereto.

The aryl group includes, for example, a phenyl group, naphthyl group, anthracenyl group and phenanthrenyl group, among which a phenyl or naphthyl group is preferable from the viewpoint of easy availability and physical properties.

The polymer having a hydroxyaryl group in a side chain, which can be used in this embodiment, includes polymers containing at least one of structural units represented by the general formula (14) to (17) below. However, the invention is not limited thereto.

General formula (14)

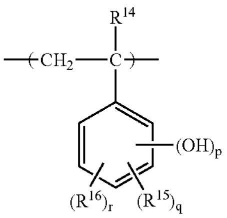

-continued

General formula (15)

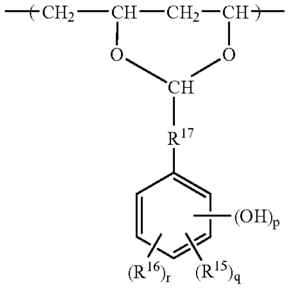

General formula (16)

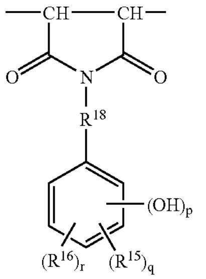

General formula (17)

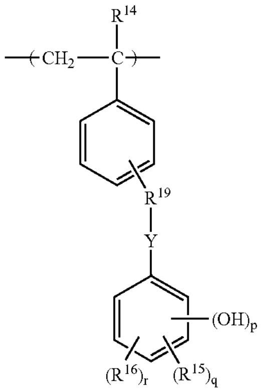

In the general formulae (14) to (17), $R^{14}$ represents a hydrogen atom or a methyl group. $R^{15}$ and $R^{16}$ may be the same or different and represent a hydrogen atom, a halogen atom, a hydrocarbon group containing 10 or less carbon atoms, an alkoxy group containing 10 or less carbon atoms, or an aryloxy group containing 10 or less carbon atoms. Further, $R^{15}$ and $R^{16}$ may be bound or condensed to form a benzene ring or a cyclohexane ring. $R^{17}$ represents a single bond or a divalent hydrocarbon group containing 20 or less carbon atoms. $R^{18}$ represents a single bond or a divalent hydrocarbon group containing 20 or less carbon atoms. $R^{19}$ represents a single bond or a divalent hydrocarbon group containing 10 or less carbon atoms. $X^1$ represents a single bond, an ether linkage, a thioether linkage, an ester linkage or an amide linkage. p represents an integer of 1 to 4. q and r independently represent an integer of 0 to 3.

These alkali-soluble polymers are described in detail in columns [0130] to [0163] in Japanese Patent Application No. 11-320997.

The alkaline water-soluble polymer compounds which can be used in this embodiment may be used alone or in combination thereof.

The amount of the alkaline water-soluble polymer compound added is preferably 5 to 95% by weight, more preferably 10 to 95% by weight, most preferably 20 to 90% by weight, based on the total solid content of the negative image recording layer.

If the amount of the alkaline water-soluble resin added is less than 5% by weight, the durability of the recording layer may be deteriorated, while if the amount thereof is higher than 95% by weight, no image may be formed.

Known recording materials usable in the negative image recording layer in the invention include negative image recording materials containing phenol derivatives described in JP-A No. 8-276558, negative image recording materials containing diazonium compounds described in JP-A No. 7-306528, and negative image recording materials using polymers having a heterocyclic group having an unsaturated bond in a ring, produced through crosslinking reaction by an acid catalyst, described in JP-A No. 10-203037, and the recording layers described in these publications can be applied to the acid-crosslinking layer as the negative image recording layer in the invention.

Other Components

In addition to the components described above, various compounds may be added if necessary in the invention. For example, dyes having large absorption in the visible light range can be used as dyes for images. Further, pigments such as phthalocyanine type pigments, azo type pigments, carbon black and titanium oxide can also be preferably used.

These coloring materials are preferably added to facilitate distinction of the image region from the non-image region after image formation. The amount of the dye is 0.01 to 10% by weight based on the total solid content of the negative image recording layer coating solution.

In the invention, when the negative image recording layer is a photo-polymerizable layer, a small amount of a heat-polymerization inhibitor is desirably added to inhibit undesired heat polymerization of the compound having a radical-polymerizable ethylenically unsaturated double bond in the coating solution during preparation or storage. Examples of suitable heat-polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), N-nitroso-N-phenylhydroxylamine aluminum salt etc. The amount of the heat-polymerization inhibitor added is preferably about 0.01% to about 5% by weight relative to the total weight of the composition. To prevent the inhibition of polymerization by oxygen, a higher fatty acid derivative such as behenic acid or behenic amide may be added as necessary so that it is allowed to be locally present on the surface of the negative image recording layer in the drying step after application. The amount of the higher fatty acid derivative added is preferably about 0.1% to about 10% by weight relative to the entire composition.

For improving the stability of the negative image recording layer to development treatment under development conditions, the negative image recording layer coating solution in the invention can contain nonionic surfactants such as those described in JP-A Nos. 62-251740 and 3-208514 and amphoteric surfactants such as those described in JP-A Nos. 59-121044 and 4-13149.

Examples of the nonionic surfactants include sorbitan tristearate, sorbitan monopalmitate, sorbitan trioleate, stearate monoglyceride, polyoxyethylene nonyl phenyl ether etc.

Examples of the amphoteric surfactants include alkyl di(aminoethyl)glycine, alkyl polyaminoethyl glycine hydrochloride, 2-alkyl-N-carboxyethyl-N-hydroxyethyl imidazolium betaine and N-tetradecyl-N,N-betaine type surfactants (e.g. trade name: Amogen K, Dai-Ichi Kogyo Co., Ltd.).

The amount of the nonionic surfactant and amphoteric surfactant in the negative image recording layer coating solution is preferably 0.05 to 15% by weight, more preferably 0.1 to 5% by weight.

Further, a plasticizer is added as necessary to the negative image recording layer coating solution in order to confer e.g. flexibility on the coating. For example, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate are used.

Substrate

The substrate used in the invention is not particularly limited insofar as it is a dimensionally stable plate, and examples thereof include a paper, a paper with plastics (e.g., polyethylene, polypropylene, polystyrene etc.) laminated thereon, a metal plate (e.g., aluminum, zinc, copper etc.), plastic film (e.g., diacetate cellulose, triacetate cellulose, propionate cellulose, butyrate cellulose, acetate butyrate cellulose, nitrate cellulose, polyethylene terephthalate, polyethylene, polystyrene, polypropylene, polycarbonate, polyvinyl acetal etc.), etc. These may be single-component sheets such as resinous film and metal plate, or laminates consisting of two or more materials laminated therein, such as a paper or plastic film having the above-described metal laminated or vapor-deposited thereon or a laminate sheet consisting of different plastic films, etc.

The substrate is preferably a polyester film or an aluminum plate, among which the aluminum plate is particularly preferable because it is excellent in dimensional stability and relatively inexpensive. The aluminum plate is preferably a pure aluminum plate or an alloy plate based on aluminum containing a trace of different elements, and may be a plastic film having aluminum laminated or vapor-deposited thereon. The different elements contained in the aluminum alloy include silicon, iron, manganese, copper, magnesium, chrome, zinc, bismuth, nickel, titanium etc. The content of the different elements in the alloy is up to 10% by weight. Particularly preferable aluminum in the invention is pure aluminum, but because production of absolutely pure aluminum is difficult in refining techniques, aluminum may contain a trace of different elements. The composition of the aluminum plate thus used in the invention is not limited, and any aluminum plates made of a known and conventionally used aluminum material can be used as necessary.

The thickness of the aluminum plate is about 0.1 to 0.6 mm, preferably 0.15 to 0.4 mm, particularly preferably 0.2 to 0.3 mm.

Before the surface of the aluminum plate is roughened, degreasing treatment with e.g. a surfactant, an organic solvent or an aqueous alkali solution is conducted as necessary for removal of rolling oil on the surface thereof.

The treatment of roughening the surface of the aluminum plate is conducted in various methods such as a method of mechanical surface roughening, a method of surface roughening by electrochemical dissolution of the surface and a method of chemically and selectively dissolving the surface. The mechanical method can make use of known techniques such as ball grinding, brush grinding, blast grinding and buff grinding. The electrochemical roughening method includes a method of roughening the surface in a hydrochloric acid or nitric acid electrolyte by use of alternating current or direct current. Further, a combination of both the methods can also be utilized as disclosed in JP-A No. 54-63902.

After the aluminum plate thus surface-roughened is subjected as necessary to alkali etching treatment and neutralization treatment, the plate can be subjected to anodizing treatment in order to improve the water retention and abrasion resistance of the surface. The electrolyte for use in the anodizing treatment of the aluminum plate can be selected from various electrolytes for forming a porous oxide film, and generally sulfuric acid, phosphoric acid, oxalic acid, chromic acid or a mixed acid thereof is used. The concentration of the electrolyte is determined suitably depending on the type of the electrolyte.

The conditions for the anodizing treatment are varied depending on the electrolyte used and cannot be generalized, but it is usually preferable that the concentration of the electrolyte is 1 to 80% by weight, the liquid temperature is 5 to 70° C., the current density is 5 to 60 $A/dm^2$, the voltage is 1 to 100 V, and the electrolysis time is 10 seconds to 5 minutes.

The amount of the anodized film is preferably not less 1.0 $g/m^2$, more preferably in the range of 2.0 to 6.0 $g/m^2$. If the anodized film is less than 1.0 $g/m^2$, the printing resistance becomes insufficient and the non-image region on the planographic printing plate is easily marred to have the so-called "mar staining" which is caused by ink adhering to the mar upon printing.

The printing surface of the substrate in the planographic printing plate is subjected to such anodizing treatment, but because of the line of electric force sent to the back thereof, 0.01 to 3 $g/m^2$ anodized film is generally formed on the back as well.

The treatment for rendering the surface of the substrate hydrophilic, conducted after the anodizing treatment described above, can make use of treatment methods known in the art. Such hydrophilicity-conferring treatment includes an alkali metal silicate (e.g., a sodium silicate aqueous solution) method disclosed in U.S. Pat. Nos. 2,714,066, 3,181,461, 3,280,734 and 3,902,734. In this method, the substrate is dipped or electrolyzed in an aqueous solution of sodium silicate. Alternatively, a method of treatment with potassium fluorozirconate as disclosed in JP-B No. 36-22063 or a method of treatment with polyvinyl phosphonic acid as disclosed in U.S. Pat. Nos. 3,276,868, 4,153,461, and 4,689,272 is used.

Among these treatments, particularly preferable hydrophilicity-conferring treatment in the invention is treatment with silicates. The treatment with silicates is described below.

The anodized film on the aluminum plate which was subjected to the treatment described above is dipped for example at 15 to 80° C. for 0.5 to 120 seconds in an aqueous solution of an alkali metal silicate at a concentration of 0.1 to 30% by weight, preferably 0.5 to 10% by weight, at a pH 10 to 13 at 25° C. If the pH value of the aqueous alkali metal silicate solution is 10 or less, the solution is gelled, while if the pH value is higher than 13.0, the anodized film is dissolved. As the alkali metal silicate used in the invention, sodium silicate, potassium silicate, lithium silicate etc. are used. The hydroxide used for raising the pH value of the aqueous alkali metal silicate solution includes sodium hydroxide, potassium hydroxide, lithium hydroxide etc. Alkaline earth metal salts or the group IVB metal salts may be incorporated into the treating solution described above. The alkaline earth metal salts include nitrates such as calcium nitrate, strontium nitrate, magnesium nitrate and barium nitrate, and water-soluble salts such as nitrate, hydrochloride, phosphate, acetate, oxalate and borate. The group IVB metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride etc. The alkaline earth metal salts or the group IVB metal salts can be used singly or in combination thereof. The amount of these metal salts is preferably in the range of 0.01 to 10% by weight, more preferably 0.05 to 5.0% by weight.

Because the hydrophilicity of the surface of the aluminum plate is further improved by silicate treatment, the ink hardly adheres to the non-image region during printing, and anti-fouling performance is improved.

Back Coat Layer

The planographic printing plate precursor of the invention is provided as necessary with a back coat on the back of the substrate. The back coat is preferably a coating layer containing metal oxides obtained by hydrolysis and polycondensation of organic polymer compounds described in JP-A No. 5-45885 and organic or inorganic metal compounds described in JP-A No. 6-35174.

Among these coating layers, coating layers of metal oxides obtained from alkoxy silicon compounds such as $Si(OCH_3)_4$, $Si(OC_2H_5)_4$, $Si(OC_3H_7)_4$ and $Si(OC_4H_9)_4$ are particularly preferable because these layers are excellent in development resistance and these starting materials are available easily and inexpensively.

Method of Producing the Planographic Printing Plate Precursor

The planographic printing plate precursor of the invention is produced by forming a negative image recording layer by coating the substrate with a solution of the above-described components in a solvent.

The solvent used includes, but is not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methyl pyrrolidone, dimethyl sulfoxide, sulfolane, γ-butyrolactone, toluene and water. These solvents are used alone or as a mixture thereof. The concentration of the above components (total solid content including additives) in the solvent is preferably 1 to 50% by weight.

The amount of the recording layer (solids content) coated and dried on the substrate is varied depending on the intended use, but generally the amount thereof for the planographic printing plate precursor is preferably 0.5 to 5.0 $g/m^2$. For coating, various methods can be used, and for example, bar coating, rotational coating, spray coating, curtain coating, dip coating, air knife coating, blade coating and roll coating can be mentioned. As the amount of the coating is decreased, the apparent sensitivity is raised, but the film characteristics of the negative image recording layer performing a function of recording images are lowered.

Overcoat Layer

The planographic printing plate precursor of the invention may be provided if necessary with an overcoat layer on the negative image recording layer containing a photopolymerizable compound. The recording layer is exposed to light usually in the air, and by the overcoat layer, low-molecular compounds such as oxygen and basic materials in the air, which will inhibit the image-forming reaction occurring in the recording layer upon exposure to light, are prevented from penetrating into the recording layer, so that the image-forming reaction by light exposure in the air can be prevented from being inhibited. Accordingly, the desired characteristics of the overcoat layer are low permeability of low-molecular compounds such as oxygen, good permeability of light used in light exposure, excellent adhesion to the recording layer, and an ability to be easily removed in the development step after exposure to light.

The overcoat layer has been devised and described in detail in U.S. Pat. No. 3,458,311 and JP-A No. 55-49729. The materials which can be used in the overcoat layer are preferably water-soluble polymers relatively excellent in crystallinity, and specifically, water-soluble polymers such as polyvinyl alcohol, polyvinyl pyrrolidone, acidic celluloses, gelatin, gum arabic and polyacrylic acid are known, among which polyvinyl alcohol can be used as a major component to give the best result to basic characteristics such as oxygen barrier properties and removability by development. The polyvinyl alcohol used in the overcoat layer may be partially replaced by ester, ether and acetal insofar as it has unsubstituted vinyl alcohol units for giving necessary oxygen barrier properties and water solubility. Similarly, it may partially have other copolymerizable components.

Examples of the polyvinyl alcohol include those hydrolyzed at a degree of 71 to 100% with a molecular weight in the range of 300 to 2400. Specifically, mention is made of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (all of which are trade names, manufactured Kuraray Co., Ltd.).

The components (PVA selected and additives used) in the overcoat layer, the amount of the coating, etc. are selected in consideration of fogging, adhesion and mar resistance in addition to oxygen barrier properties and removability by development. In general, as the degree of hydrolysis of PVA used becomes higher (or the content of unsubstituted vinyl alcohol units in the overcoat layer becomes higher) or as the film thickness is increased, there are brought abut higher oxygen barrier properties which are advantageous to sensitivity. However, if the oxygen barrier properties are improved extremely, there arises the problem that undesired polymerization reaction may occur during production or storage, or unnecessary fog and thicker lines of an image maybe generated upon exposure of the image to light. In addition, the adhesion of the overcoat layer to the region of the image and the mar resistance thereof are also very important for handling of the printing plate. That is, if a hydrophilic layer containing a water-soluble polymer is laminated on a lipophilic polymerized layer, the layer may be released easily due to insufficient adhesion, and at the released portion, defects such as insufficient curing of the film occur because of the inhibition of polymerization by oxygen.

To solve this problem, various proposals have been made of improving the adhesion between the 2 layers. For example, U.S. Pat. Nos. 292,501 and 44,563 describe that an acrylic emulsion or a water-insoluble vinyl pyrrolidone-vinyl acetate copolymer is mixed in an amount of 20 to 60% by weight in a hydrophilic polymer based on polyvinyl alcohol and then laminated on a polymer layer to achieve satisfactory adhesion. Such known techniques can be applied to the overcoat layer in the invention. The method of applying the overcoat layer is described in detail in e.g. U.S. Pat. No. 3,458,311 and JP-A No. 55-49729.

Further, the overcoat layer can be endowed with other functions. For example, a coloring agent (water-soluble dye etc.) excellent in permeability of lights used in light exposure (for example, infrared rays of wavelengths ranging from about 760 nm to 1200 nm for the planographic printing plate precursor of the invention) and capable of efficiently absorbing lights of wavelengths not involved in light exposure can be added to further improve safe write suitability without causing a drop in sensitivity.

The planographic printing plate precursor prepared in the manner described above is subjected usually to exposure of an image to light and development treatment.

The light source of active rays used in exposure of an image to light includes, for example, a mercury lamp, metal halide lamp, xenon lamp, chemical lamp, carbon arc lamp etc. The radiation includes X rays, ion beam, far infrared rays etc. Further, i rays and high-density energy beam (laser beam) are also used. The laser beam includes a helium-neon laser, argon laser, krypton laser, helium-cadmium laser, KrF excimer laser etc. In the invention, a light source having emission wavelengths in the near infrared to infrared regions is preferable, and a solid laser and semiconductor laser are particularly preferable.

The output of the laser is preferably 100 mW or more, and a multi-beam laser device is preferably used to reduce the time of light exposure. The time of light exposure per pixel is preferably 20 μseconds or less. The energy irradiated on the negative image recording layer is preferably 10 to 300 $mJ/cm^2$.

After exposure of the image to light, the planographic printing plate precursor of the invention is developed preferably with water or an aqueous alkaline solution.

In the invention, development treatment may be conducted immediately just after laser irradiation, but a heating treatment step can be provided between the laser irradiation step and development step. Heating treatment is conducted preferably in the range of 80 to 150° C. for 10 seconds to 5 minutes. At the time of laser irradiation, the laser energy necessary for recording can be reduced by this heating treatment.

The developing solution is preferably an aqueous alkaline solution, and the pH range is preferably in the range of 10.0 to 13.5, and development treatment with an aqueous alkaline solution in the range of pH 10.5 to 13.0 is more preferable. When an aqueous alkaline solution with a pH value of less than 10.0 is used, the non-image region tends to be easily stained, while upon development treatment with an aqueous solution of a pH value of higher than 13.5, the strength of the image region may be lowered.

When the aqueous alkaline solution is used as a developing solution, the developing solution and its supplementary solution for the planographic printing plate precursor of the invention may be an aqueous alkali solution known in the art. For example, mention is made of inorganic alkali salts such as sodium silicate, potassium silicate, tribasic sodium phosphate, tribasic potassium phosphate, tribasic ammonium phosphate, dibasic sodium phosphate, dibasic potassium phosphate, dibasic ammonium phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Further, use is made of organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, and pyridine.

These alkali agents are used singly or in combination thereof.

It is also known that when the development is conducted in an automatic developer, an aqueous solution of higher alkali strength (supplementary solution) than in the developing solution is added to the developing solution, whereby a large number of planographic printing plate precursors can be treated without exchanging the developing solution in a development tank for a prolonged period of time. This supplementing system can also be preferably applied to the invention.

For promoting and suppressing developing performance, for dispersing development residues and for improving the affinity of the image region on the printing plate for ink, various surfactants and organic solvents can be added as necessary to the developing solution and the supplementary solution.

The surfactant is added to the developing solution in the range of preferably 1 to 20% by weight, more preferably 3 to 10% by weight. If the amount of the surfactant added is less than 1% by weight, its effect of improving development cannot be sufficiently obtained, while if the surfactant is added in an amount of higher than 20% by weight, there easily arise problems such as a reduction in strength e.g. abrasion resistance of images.

Preferable surfactants include anionic, cationic, nonionic and amphoteric surfactants. Examples of the surfactant include sodium salts of lauryl alcohol sulfate, ammonium salts of lauryl alcohol sulfate, sodium salts of octyl alcohol sulfate, alkyl aryl sulfonates such as sodium isopropyl naphthalene sulfonate, sodium isobutyl naphthalene sulfonate, sodium polyoxyethylene glycol mononaphthyl ether sulfate, sodium dodecyl benzene sulfonate and sodium m-nitrobenzene sulfonate, $C_{8-22}$ higher alcohol sulfates such as sodium secondary alkyl sulfate, fatty alcohol phosphates such as sodium cetyl alcohol phosphate, alkylamide sulfonates such as $C_{17}H_{33}CON(CH_3)CH_2CH_2SO_3Na$, dibasic aliphatic sulfonates such as sodium dioctyl sulfosuccinate and sodium dihexyl sulfosuccinate, ammonium salts such as lauryl trimethyl ammonium chloride and lauryl trimethyl ammonium metosulfate, amine salts such as stearamide ethyl diethyl amine acetate, polyvalent alcohols such as glycerol fatty monoester and pentaerythritol fatty monoester, and polyethylene glycol ethers such as polyethylene glycol mononaphthyl ether and polyethylene glycol mono(nonylphenol)ether.

The organic solvent is preferably the one having a water solubility of about 10% by weight or less, more preferably 5% by weight or less. Examples of such organic solvents include 1-phenyl ethanol, 2-phenyl ethanol, 3-phenyl propanol, 1,4-phenyl butanol, 2,2-phenyl butanol, 1,2-phenoxy ethanol, 2-benzyloxy ethanol, o-methoxy benzyl alcohol, m-methoxy benzyl alcohol, p-methoxy benzyl alcohol, benzyl alcohol, cyclohexanol, 2-methyl cyclohexanol, 4-methyl cyclohexanol and 3-methyl cyclohexanol. The content of the organic solvent is preferably 1 to 5% by weight relative to the total weight of the developing solution used. The amount of the organic solvent used is related closely to the amount of the surfactant used, and as the amount of the organic solvent is increased, the amount of the surfactant is preferably increased. This is because if the organic solvent is used in a higher amount in the presence of a smaller amount of a surfactant, the organic solvent is not dissolved, thus failing to secure good development.

The developing solution and the supplementary solution can contain additives such as a deforming agent and hard water-softening agent. The hard water-softening agent includes, for example, polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylenediamintriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; aminopolycarboxylic acids such as 1,3-diamino-2-propanol tetraacetic acid, potassium salt thereof, sodium salt thereof; 2-phosphonobutanetricarboxylic acid-1,2,4, potassium salt thereof, sodium salt thereof; 2-phosphonobutanonetricarboxylic acid-2,3,4, potassium salt thereof, sodium salt thereof; 1-phosphonoethanetricarboxylic acid-1,2,2, potassium salt thereof, sodium salt thereof; organic phosphonic acids such as 1-hydroxyethane-1,1-diphosphonic acid, potassium salt thereof, sodium salt thereof, and aminotri(methylene phosphonic acid), potassium salt thereof, and sodium salt thereof. The optimum amount of the hard water-softening agent is varied depending on the hardness and amount of hard water used, but generally the hard water-softening agent is contained in the range of 0.01 to 5% by weight, more preferably 0.01 to 0.5% by weight, in the developing solution used.

When the planographic printing plate is developed with an automatic developing machine, the developing solution is exhausted depending on throughput, so throughput capacity may be recovered using a supplementary solution or a fresh developing solution. In this case, the solution is supplemented by a method described in U.S. Pat. No. 4,882,246.

The developing solution containing a surfactant, an organic solvent and a reducing agent includes, for example, a developer composition comprising benzyl alcohol, an anionic surfactant, an alkali agent and water described in JP-A No. 51-77401, a developer composition comprising benzyl alcohol, an anionic surfactant, and an aqueous solution containing a water-soluble sulfite described in JP-A No. 53-44202, and a developer composition comprising an organic solvent having a water solubility of 10% by weight or less at ordinary temperatures, an alkali agent and water described in JP-A No. 55-155355, and these compositions are also used preferably in the invention.

The printing plate which was subjected to development treatment with the developing solution and the supplementary solution described above is post-treated with washing water, a surfactant-containing rinse, and an insensitizing greasing solution containing gum arabic and starch derivatives. In the post-treatment of the planographic printing plate of the invention, these treatments can be used in combination.

In the industrial fields of plate-making and printing, an automatic developing machine for printing plate is used widely in recent years for rationalization and standardization for the operation of plate-making. This automatic developing machine consists generally of a developing part, a post-treatment part, a device for transferring a printing plate, each treating solution bath and a spraying device, and while a printing plate after light exposure is transferred horizontally, each treating solution drawn by a pump is sprayed for development onto the printing plate through a spray nozzle. Recently, a method of dipping-treating a printing plate precursor in a treating solution bath filled with a treating solution while transferring it by use of guide rolls in the solution is also known. Such automatic treatment can be carried out by supplementing each treating solution with a supplementary solution, depending on throughput, operation time etc. Further, the supplementary solution can be automatically fed while the electrical conductance is sensed with a sensor.

The so-called "disposable" treatment system for treatment with a substantially virgin treating solution can also be applied.

The planographic printing plate thus obtained is coated with an insensitizing greasing gum as necessary and then subjected to printing, but if the planographic printing plate with higher printing resistance is desired, it is subjected to burning treatment.

When the planographic printing plate is subjected to burning, the plate before burning is treated preferably with a surface-adjusting solution described in each of JP-B Nos. 61-2518, 55-28062, JP-A Nos. 62-31859 and 61-159655.

This treatment makes use of a method of applying a sponge or adsorbent cotton impregnated with the surface-adjusting solution onto the planographic printing plate, or dipping the printing plate in a vat filled with the surface-adjusting solution, or coating by an automatic coater. Better results are given by applying the surface-adjusting solution uniformly by an squeezer or with squeeze rollers.

Generally, the amount of the surface-adjusting solution applied is preferably 0.03 to 0.8 $g/m^2$ (dry weight).

The planographic printing plate coated with the surface-adjusting solution is dried as necessary and then heated at high temperatures by a burning processor (e.g. a burning processor BP-1300 available from Fuji Photo Film Co., Ltd.). In this case, the heating temperature and time are varied depending the type of components forming the image, but are preferably 180 to 300° C. and 1 to 20 minutes.

After burning treatment, the planographic printing plate can be subjected to conventional treatments such as washing with water and gum drawing as necessary, but if a surface-adjusting solution containing water-soluble polymers etc. is used, the so-called insensitizing greasing treatment such as gum drawing can be omitted.

The planographic printing plate obtained in the manner described above is loaded onto an offset printing machine etc. and used for printing on a large number of papers.

EXAMPLES

Hereinafter, the present invention is described by reference to the following examples, but the scope of the invention is not limited to the examples.

Preparation of an Inserting Paper

Inserting Paper 1

A rosin sizing agent was added in an amount of 0.4% by weight to a paper material prepared by beating bleached kraft pulp and diluting it to a concentration of 4%, and then aluminum sulfate was added thereto until the pH became 5.0. This paper material was coated with a starch-based paper-strengthening agent in an amount of 3.0% by weight, to prepare an inserting paper 1 having a Bekk smoothness of 60 sec., a density of 0.8 $g/cm^3$, a water content of 6.0% and a basis weight of 38 $g/m^2$ in the surface to contact with the outermost surface at the side of a negative image recording layer. The properties of the inserting paper 1 are summarized in Table 2.

Inserting Paper 2

A paper produced by using the same sizing agent and fixing agent from 100% bleached kraft pulp from broadleaf trees, which had a Bekk smoothness of about 500 sec., a density of 0.8 g/cm$^3$, a water content of 4.5%, a pH value of 5.5 and a basis weight of 30 g/m$^2$ in the surface to contact with the outermost surface at the side of a negative image recording layer, was used as inserting paper 2. The properties of the inserting paper 2 are summarized in Table 2.

TABLE 2

| | Basis weight (g/m$^2$) | Bekk smoothness sec | Water content (%) | Density (g/m$^3$) |
|---|---|---|---|---|
| Inserting paper 1 | 38 | 60 | 8 | 0.8 |
| Inserting paper 2 | 30 | 500 | 4.5 | 0.8 |

Example 1

Preparation of a Substrate

A melt of an alloy containing 99.5% or more aluminum, 0.30% Fe, 0.10% Si, 0.02% Ti, and 0.013% Cu was subjected to cleaning treatment and then cast. In this cleaning treatment, the melt was degassed to remove unnecessary gas such as hydrogen, and filtered through a ceramic tube filter. Casting was conducted using a DC casting method. After 10-mm surface layer was removed from the coagulated ingot plate of 500 mm in thickness, the plate was subjected to homogenization treatment at 550° C. for 10 hours such that intermetallic compounds were not agglomerated.

Then, the plate was hot-rolled at 400° C., then annealed at 500° C. for 60 seconds in a continuous annealing furnace and cold-rolled to form an aluminum rolled plate of 0.30 mm in thickness. By regulating the roughness of pressure rollers, the central line average surface roughness Ra after cold rolling was regulated to be 0.2 μm. Thereafter, the plate was placed in a tension leveler to improve flatness.

Then, the plate was subjected to surface treatment to form a substrate for planographic printing plate.

First, the surface of the aluminum plate was defatted at 50° C. for 30 seconds in 10% aqueous sodium aluminate to remove the rolling oil therefrom and then neutralized with 30% aqueous sulfuric acid at 50° C. for 30 seconds, to remove smuts therefrom.

Then, the surface of the substrate was roughened (i.e. grained) thereby facilitating the adhesion of the substrate to a photosensitive layer while conferring water retention characteristics on a non-image region. The substrate was subjected to electrolytic graining by floating the aluminum web in an aqueous solution containing 1% nitric acid and 0.5% aluminum nitrate at 45° C. and electrifying it at 240 C/dm$^2$ at the side of the anode at a current density of 20 A/dm$^2$ in an alternating waveform in the duty ratio of 1:1 from an indirect feeder cell. Thereafter, the substrate was etched at 50° C. for 30 seconds in 10% aqueous sodium aluminate and then neutralized with 30% aqueous sulfuric acid at 50° C. for 30 seconds to remove smuts therefrom.

Further, the substrate was anodized to form an oxide film thereon, to improve abrasion resistance, chemical resistance and water retention characteristics. The substrate was subjected to electrolysis in 20% aqueous sulfuric acid as the electrolyte at 35° C. at a direct current of 14 A/dm$^2$ from an indirect feeder cell while floating the aluminum web in the electrolyte, to form a 2.5 g/m$^2$ anodized film thereon. The Ra (central line surface roughness) of the aluminum substrate thus prepared was 0.5 μm.

Formation of a Negative Image Recording Layer

Then, a recording layer coating solution [PL-1] shown below was prepared, applied via a wire bar onto the aluminum substrate which had been subjected to the surface treatment described above, and dried at 115° C. for 45 seconds in a hot-air oven to form a negative planographic printing plate precursor [P-1]. The amount of the coating after drying was in the range of 1.2 to 1.3 g/m$^2$.

| Recording layer coating solution [PL-1] | |
|---|---|
| Dodecyl stearate (lubricating agent) | 0.02 g |
| Infrared ray absorbing agent (IR-1) | 0.08 g |
| Polymerization initiator (OS-1) | 0.10 g |
| Dipentaerythritol hexaacrylate | 1.00 g |
| Acryl methacrylate-methacrylic acid copolymer (molar ratio 80:20) (weight average molecular weight 120,000) | 1.00 g |
| Victoria Pure Blue naphthalene sulfonate | 0.04 g |
| Fluorine-type surfactant (trade name: Megafack F-176, from Dainippon Ink and Chemicals, Inc.) | 0.01 g |
| Stearoyl methyl amide | 0.02 g |
| Methyl ethyl ketone | 14.0 g |
| Methanol | 6.5 g |
| 1-Methoxy-2-propanol | 10.0 g |

The structures of the infrared ray absorbing agent (IR-1) and the polymerization initiator (OS-1) used in the recording layer coating solution are as shown below.

IR-1

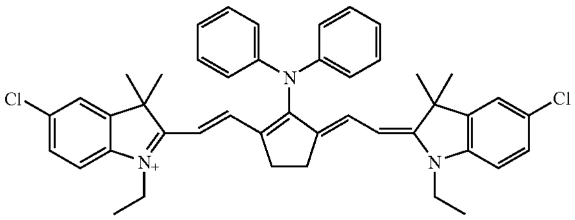

$CF_3SO_3^-$

OS-1

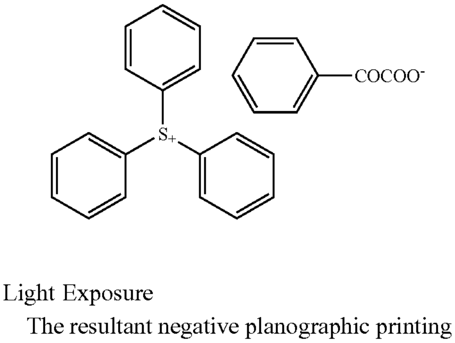

Light Exposure

The resultant negative planographic printing plate precursor [P-1] was exposed to light under the conditions of a power of 9 W, an external drum revolution of 210 rpm, an energy of 100 mJ/cm$^2$ on the plate precursor and a resolution of 175 1 pi by Trendsetter 3244VFS (trade name, manufactured by Creo Co. Ltd.) equipped with a water-cooling 40-W infrared semiconductor laser, whereby a solid image and 0.5 to 99.5% dotted image were exposed to light.

Development Treatment

The dotted image exposed to light was subjected to development treatment by an automatic developing machine (trade name: LP-940H, manufactured by Fuji Photo Film Co., Ltd.). As the developing solution, a solution (pH 11.1 at 25° C.) of DV-2R (trade name, manufactured by Fuji Photo Film Co., Ltd.) diluted with water in a ratio of 1:17 was used. As the supplementary solution, a solution of DV-2R (trade name, manufactured by Fuji Photo Film Co., Ltd.) diluted with water in a ratio of 1:10 was used. The temperature of the development bath was 30° C. The finisher used was a solution of FN-6 (trade name, manufactured by Fuji Photo Film Co., Ltd.) diluted with water in a ratio of 1:1.

Evaluation

The resultant negative planographic printing plate precursor [P-1] and the inserting paper 1 were laminated to form a laminate 1. The dynamic friction coefficient between the resultant negative planographic printing plate precursor [P-1] and the inserting paper 1 was 0.40.

Mar Resistance

The formed laminate 1 was transferred on an auto-loader to the printing machine, set in a cassette, transferred from the setting zone to a light-exposing zone and then to a developing zone where the laminate 1 was developed, and the occurrence of mars was evaluated under the following criteria. The conditions for light exposure and development are as described above. The evaluation results are shown in Table 3.

○: No mars are observed.
Δ: Slight mars are observed.
X: Considerable mars are recognized.

Evaluation of Image Staining

The negative planographic printing plate precursor [P-1] thus examined for mar resistance was then used in printing with commercial oil ink in a printing machine SOR-M (trade name, manufactured by Heidelberg). Whether staining on the non-image region occurred or not was examined with naked eyes to evaluate staining on the image. The conditions for light exposure and development are as described above. The evaluation results are shown in Table 3.

○: No straining is observed.
Δ: Slight straining is observed.
X: Considerable straining is recognized.

Evaluation of Transferability

The formed laminate 1 was laminated to a height of 1 meter and vibrated for 10 minutes, and the sliding (mm) of the negative planographic printing plate precursor [P-1] was measured to evaluate transferability. The evaluation results are shown in Example 2

A laminate 2 was formed and evaluated in the same manner as in Example 1 except that the inserting paper 2 was used in place of the inserting paper 1 constituting the laminate 1. The dynamic friction coefficient between the negative planographic printing plate precursor [P-1] and the inserting paper 2 was 0.50. The evaluation results are shown in Table 3.

Example 3

A laminate 3 was formed and evaluated in the same manner as in Example 1 except that a recording layer coating solution [PL-2] shown below was used instead of [PL-1], drying was conducted under a condition of at 115° C. for 45 seconds, and further laminating an overcoat layer. The overcoat layer was formmed by applying a mixture aqueous solution including polyvinyl alcohol (saponification value: 98 mol %, degree of polymerization: 500), polyvinyl pyrrolidone (trade name: Rubiscol K-30, manufactured by BASF Co. Ltd.), and sodium behenate (a lubricating agent) with a wire bar and drying at 125° C. for 75 seconds in a hot-air oven. The amount of the coating of the overcoat layer after drying was 2.45 g/m$^2$, in which 85% by weight was PVA and 5% by weight was sodium behenate. The evaluation results are shown in Table 3.

| Recording layer coating solution [PL-2] | |
|---|---|
| Infrared ray absorbing agent (IR-2) | 0.08 g |
| Polymerization initiator (OS-2) | 0.25 g |
| Dipentaerythritol hexaacrylate | 1.00 g |
| Binder (BT-1) | 1.00 g |
| Ethylviolet chloride | 0.04 g |
| Fluorine surfactant (trade name: Megafak F-176, from Dainippon Ink and Chemicals, Inc.) | 0.03 g |
| Carboxylic acid compound | 0.15 g |
| Methyl ethyl ketone | 10.4 g |
| Methanol | 4.83 g |
| 1-Methoxy-2-propanol | 10.4 g |

The structures of the infrared ray absorbing agent (IR-2), the polymerization initiator (OS-2), and the binder (BT-1) used in the recording layer coating solution are as shown below.

TABLE 3

| | Constitution of the laminate | Dynamic friction coefficient | Mar resistance | Image staining | Transferability (mm) |
|---|---|---|---|---|---|
| Example 1 | Planographic printing plate precursor P-1 Inserting paper 1 | 0.4 | ○ | ○ | 4 |
| Example 2 | Planographic printing plate precursor P-1 Inserting paper 2 | 0.5 | ○ | ○ | 3 |
| Example 3 | Planographic printing plate precursor P-2 Inserting paper 1 | 0.45 | ○ | ○ | 3 |

Infrared ray absorbing agent (IR-2)

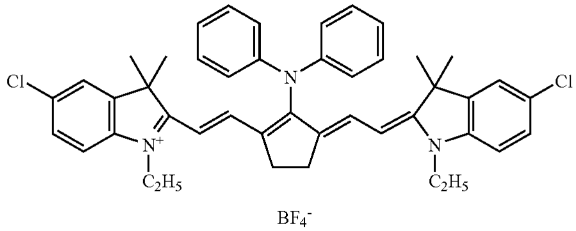

Polymerization initiator (OS-2)

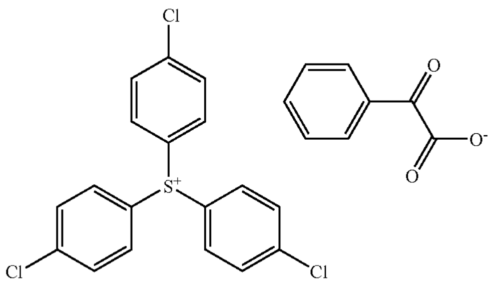

Binder (BT-1)

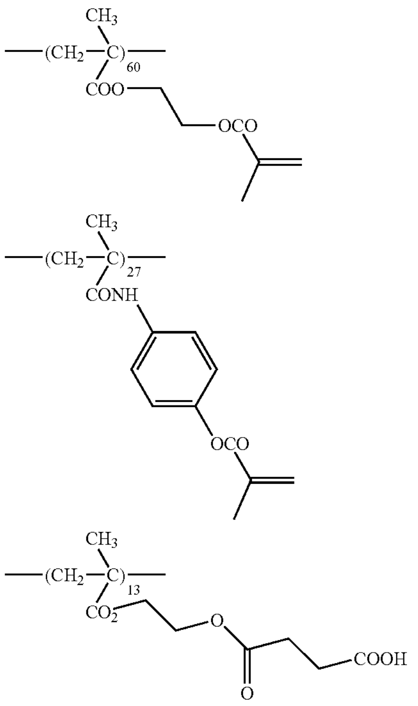

It was revealed that by adding a lubricating agent for regulating the dynamic friction coefficient to the recording layer coating solution to regulate the dynamic friction coefficient of the surface of the negative image recording layer, the planographic printing plate precursor P-1 and planographic printing plate precursor laminates 1 and 2 of the invention in Examples 1 and 2 can prevent occurrence of mars, while staining on the non-image region is at satisfactory levels. It was further revealed that the transferability of the planographic printing plate precursor laminates 1 and 2 of the invention in Examples 1 and 2 can be at satisfactory levels by regulating the dynamic friction coefficient as defined in the invention.

According to the invention, there can be provided a planographic printing plate precursor capable of forming an image of high qualities without staining on the non-image region or white mars on the image region by preventing occurrence of mars on the surface of a negative image recording layer or overcoat layer even when the planographic printing plate precursor is laminated, transferred and stored. Further, there can be provided a planographic printing plate precursor laminate preventing occurrence of mars on the surface of the negative image recording layer or overcoat layer and being excellent in transferability.

What is claimed is:

1. A planographic printing plate precursor comprising a substrate and a negative image recording layer provided on the substrate containing:

a compound that generates a radical or an acid by light or heat;

a polymerizable compound or a crosslinking compound; and an infrared ray absorbing agent, wherein a dynamic friction coefficient of the outermost surface of the planographic printing plate precursor, at the side of the negative image recording layer being provided toward an inserting paper inserted between the planographic printing plate precursors when the planographic printing plate precursors are laminated, is within a range from 0.2 to 0. 7, and wherein an additive is present on the inserted paper or the negative image recording layer which provides the dynamic friction coefficient of the outermost surface of the planographic printing plate precursor.

2. A planographic printing plate precursor according to claim 1, wherein the dynamic friction coefficient is within a range from 0.2 to 0.5.

3. A planographic printing plate precursor according to claim 1, wherein the infrared ray absorbing agent comprises at least one member selected from the group consisting of a cyanine dye, a squarylium dye, a pyrylium salt and a nickel thiolate complex.

4. A planographic printing plate precursor according to claim 1, wherein the content of the infrared ray absorbing agent is within the range from 0.01 to 50% by weight based on the total solid content of the negative image recording layer.

5. A planographic printing plate precursor according to claim 1, wherein the compound that generates the radical or the acid comprises at least one member selected from the group consisting of an iodonium salt, a diazonium salt and a sulfonium salt.

6. A planographic printing plate precursor according to claim 1, wherein the content of the compound that generates the radical or the acid is within the range from 0.1 to 50% by weight based on the total solid content of the negative image recording layer.

7. A planographic printing plate precursor comprising a substrate, a negative image recording Layer provided on the substrate, and an overcoat layer provided on the negative image recording layer, wherein the negative image recording layer contains:

a compound that generates a radical or an acid by light or heat;

a polymerizable compound or a crosslinking compound; and an infrared ray absorbing agent, wherein a dynamic friction coefficient of the outermost surface of the planographic printing plate precursor, at the side of the negative image recording layer being provided toward an inserting paper inserted between the planographic printing plate precursors when the planographic printing plate precursors are laminated, is within a range from 0.2 to 0.7 and wherein an additive is present on the inserted paper or the negative imaae recording layer which provides the dynamic friction coefficient of the outermost surface of the planographic printing plate precursor.

8. A planographic printing plate precursor according to claim 7, wherein the dynamic friction coefficient is within a range from 0.2 to 0.5.

9. A planographic printing plate precursor according to claim 7, wherein the infrared ray absorbing agent comprises at least one member selected from the group consisting of a cyanine dye, a squarylium dye, a pyrylium salt and a nickel thiolate complex.

10. A planographic printing plate precursor according to claim 7, wherein the content of the infrared ray absorbing agent is within the range from 0.01 to 50% by weight based on the total solid content of the negative image recording layer.

11. A planographic printing plate precursor according to claim 7, wherein the compound that generates the radical or the acid comprises at least one member selected from the group consisting of an iodonium salt, a diazonium salt and a sulfonium salt.

12. A planographic printing plate precursor according to claim 7, wherein the content of the compound that generates a radical or an acid is within the range from 0.1 to 50% by weight based on the total solid content of the negative image recording layer.

13. A planographic printing plate precursor laminate comprising planographic printing plate precursors and inserting paper, wherein the planographic printing plate precursors each comprise a substrate and a negative image recording layer provided on the substrate containing:

a compound that generates a radical or an acid by light or heat;

a polymerizable compound or a crosslinking compound; and an infrared ray absorbing agent;

wherein the inserting paper is inserted between the planographic printing plate precursors to be laminated;

wherein a dynamic friction coefficient of the outermost surface of the planographic printing plate precursor, at the side of the negative image recording layer being provided toward an inserting paper inserted between the planographic printing plate precursors when the planographic printing plate precursors are laminated, is within a range from 0.2 to 0.7; and wherein an additive is present on the inserted paper or the negative image recording layer which provides the dynamic friction coefficient of the outermost surface of the planographic printing plate precursor.

14. A planographic printing plate precursor laminate according to claim 13, wherein the dynamic friction coefficient is within a range from 0.2 to 0.5.

15. A planographic printing plate precursor laminate according to claim 13, wherein the infrared ray absorbing agent comprises at least one member selected from the group consisting of a cyanine dye, a squarylium dye, a pyrylium salt and a nickel thiolate complex.

16. A planographic printing plate precursor laminate according to claim 13, wherein the content of the infrared ray absorbing agent is in the range of 0.01 to 50% by weight based on the total solid content of the negative image recording layer.

17. A planographic printing plate precursor laminate according to claim 13, wherein the compound that generates the radical or the acid comprises at least one member selected from the group consisting of an iodonium salt, a diazonium salt and a sulfonium salt.

18. A planographic printing plate precursor laminate according to claim 13, wherein the content of the compound that generates the radical or the acid is within the range from 0.1 to 50% by weight based on the total solid content of the negative image recording layer.

19. A planographic printing plate precursor laminate comprising planographic printing plate precursors and inserting paper, wherein the planographic printing plate precursors each comprise a substrate, a negative image recording layer provided on the substrate, and an overcoat layer provided on the negative image recording layer, wherein the negative image recording layer contains:

a compound that generates a radical or an acid by light or heat;

a polymerizable compound or a crosslinking compound; and an infrared ray absorbing agent;

wherein the inserting paper is inserted between the planographic printing plate precursors to be laminated;

wherein a dynamic friction coefficient of the outermost surface of the planographic printing plate precursor, at the side of the negative image recording layer being provided toward an inserting paper inserted between the planographic printing plate precursors when the planographic printing plate precursors are laminated, is within a range from 0.2 to 0.7; and wherein an additive is present on the inserted paper or the negative image recording layer which provides the dynamic friction coefficient of the outermost surface of the planographic printing plate precursor.

20. A planographic printing plate precursor according to claim 1, wherein the additive is dodecyl stearate.

21. A planographic printing plate precursor according to claim 7, wherein the additive is dodecyl stearate.

22. A planographic printing plate precursor laminate according to claim 13, wherein the additive is dodecyl stearate.

23. A planographic printing plate precursor laminate according to claim 19, wherein the additive is dodecyl stearate.

* * * * *